(12) United States Patent
Ko et al.

(10) Patent No.: US 10,853,618 B2
(45) Date of Patent: Dec. 1, 2020

(54) DISPLAY DEVICE

(71) Applicant: Samsung Display Co., Ltd., Yongin-si (KR)

(72) Inventors: Gwang Bum Ko, Yongin-si (KR); Do Ik Kim, Yongin-si (KR); Seung Hwan Chung, Yongin-si (KR); Sung Hwan Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/447,336

(22) Filed: Jun. 20, 2019

(65) Prior Publication Data

US 2019/0303641 A1 Oct. 3, 2019

Related U.S. Application Data

(63) Continuation of application No. 15/968,646, filed on May 1, 2018, now Pat. No. 10,417,477.

(30) Foreign Application Priority Data

Sep. 28, 2017 (KR) .................. 10-2017-0126298

(51) Int. Cl.
*G06K 9/00* (2006.01)
*G02B 19/00* (2006.01)
(Continued)

(52) U.S. Cl.
CPC ......... *G06K 9/0004* (2013.01); *G02B 6/0053* (2013.01); *G02B 6/0088* (2013.01);
(Continued)

(58) Field of Classification Search
CPC ... G06K 9/0004; H01L 31/153; H01L 27/156; H01L 31/02327; G02B 19/0009
See application file for complete search history.

(56) References Cited

U.S. PATENT DOCUMENTS

| | | | | |
|---|---|---|---|---|
| 5,877,492 A | * | 3/1999 | Fujieda ................ | G02B 6/1245 250/208.1 |
| 8,764,270 B2 | * | 7/2014 | Shin ..................... | G02B 6/0091 362/276 |

(Continued)

FOREIGN PATENT DOCUMENTS

WO        2016098283        6/2016

OTHER PUBLICATIONS

Extended European Search Report dated Mar. 6, 2019, issued in European Patent Application No. 18196007.1.
(Continued)

*Primary Examiner* — Ahmed N Sefer
(74) *Attorney, Agent, or Firm* — H.C. Park & Associates, PLC

(57) ABSTRACT

A display device with a display panel including a display area and a plurality of pixels arranged in the display area, a photosensor layer including a sensing area overlapping the display area and a plurality of photosensors arranged in the sensing area, a light-guiding layer arranged between the display panel and the photosensor layer, the light-guiding layer includes a plurality of light-transmission holes corresponding to the plurality of photosensors, wherein the light-guiding layer includes a transparent tube bundle comprising a plurality of transparent tubes forming the light-transmission holes.

11 Claims, 24 Drawing Sheets

(51) Int. Cl.
    *H01L 31/0232*     (2014.01)
    *H01L 27/15*     (2006.01)
    *H01L 31/153*     (2006.01)
    *F21V 8/00*     (2006.01)
    *H01L 27/32*     (2006.01)
    *G02B 6/08*     (2006.01)
    *G02B 3/00*     (2006.01)
    *G02B 5/00*     (2006.01)

(52) U.S. Cl.
    CPC ........... *G02B 6/08* (2013.01); *G02B 19/0009* (2013.01); *H01L 27/156* (2013.01); *H01L 27/323* (2013.01); *H01L 27/3227* (2013.01); *H01L 27/3234* (2013.01); *H01L 31/02327* (2013.01); *H01L 31/153* (2013.01); *G02B 3/0056* (2013.01); *G02B 5/005* (2013.01)

(56) References Cited

U.S. PATENT DOCUMENTS

| | | | |
|---|---|---|---|
| 9,829,614 B2 | 11/2017 | Smith et al. | |
| 2008/0198297 A1* | 8/2008 | Choi | G02B 6/0031 349/65 |
| 2008/0205711 A1 | 8/2008 | Kishigami et al. | |
| 2010/0164906 A1 | 7/2010 | Fukunaga et al. | |
| 2011/0285680 A1 | 11/2011 | Nakamura | |
| 2013/0127792 A1 | 5/2013 | Chang et al. | |
| 2015/0029710 A1* | 1/2015 | Kim | G02F 1/133608 362/217.15 |
| 2016/0020261 A1* | 1/2016 | Kim | H01L 27/3227 362/235 |
| 2016/0027378 A1 | 1/2016 | Kim | |
| 2017/0161543 A1 | 6/2017 | Smith et al. | |
| 2017/0205558 A1 | 7/2017 | Hirayama et al. | |
| 2017/0220840 A1 | 8/2017 | Wickboldt et al. | |
| 2017/0227465 A1 | 8/2017 | Hsieh et al. | |
| 2017/0352695 A1* | 12/2017 | Tsuchiya | A61B 5/02 |
| 2018/0089491 A1 | 3/2018 | Kim et al. | |
| 2018/0373945 A1 | 12/2018 | Wu et al. | |

OTHER PUBLICATIONS

Corrected Notice of Allowance dated Jun. 10, 2019 in U.S. Appl. No. 15/968,646.

* cited by examiner

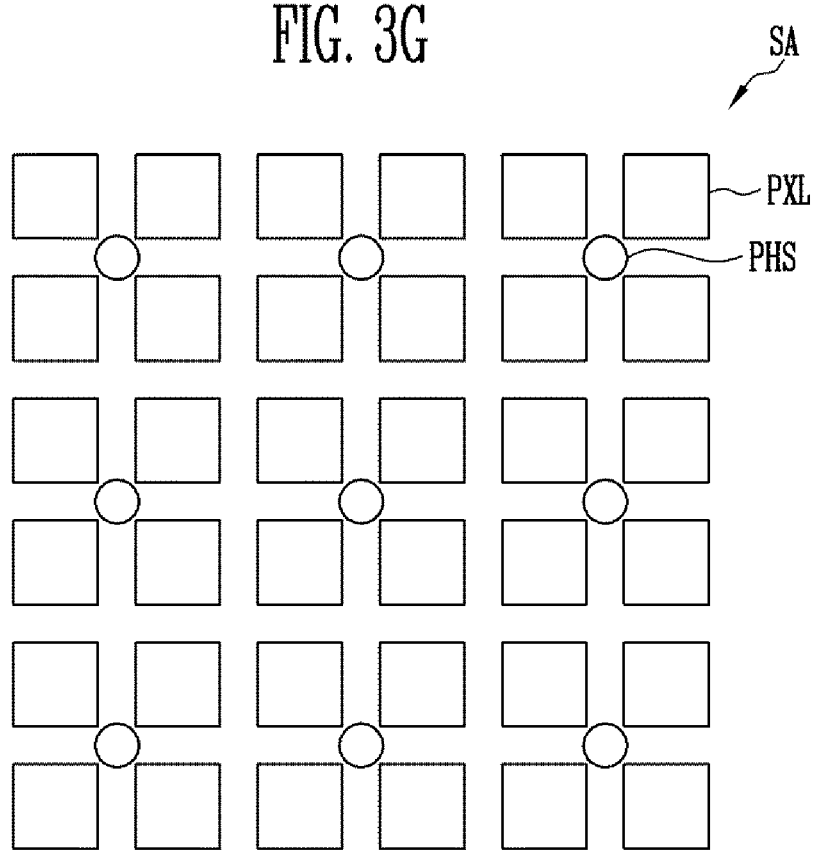

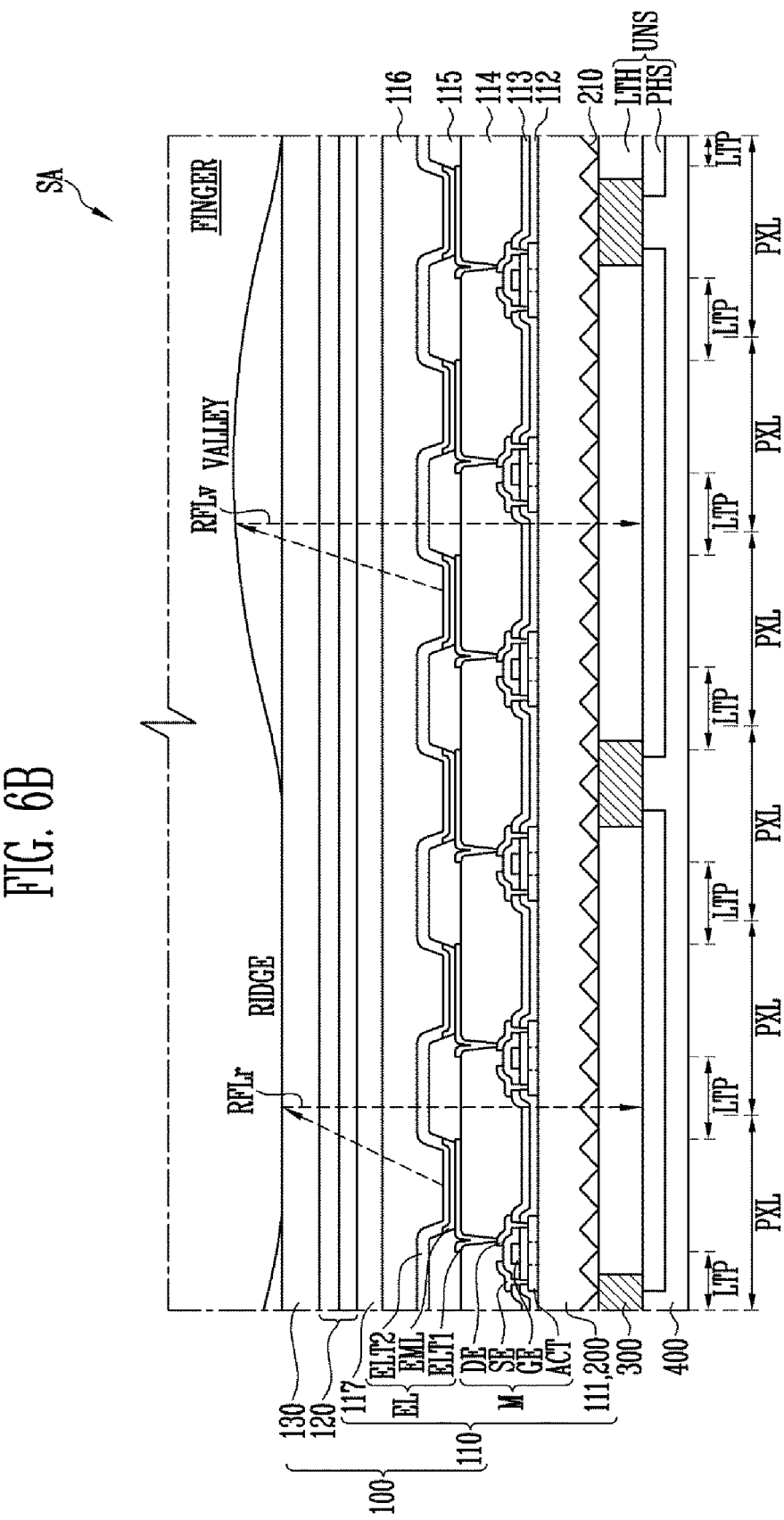

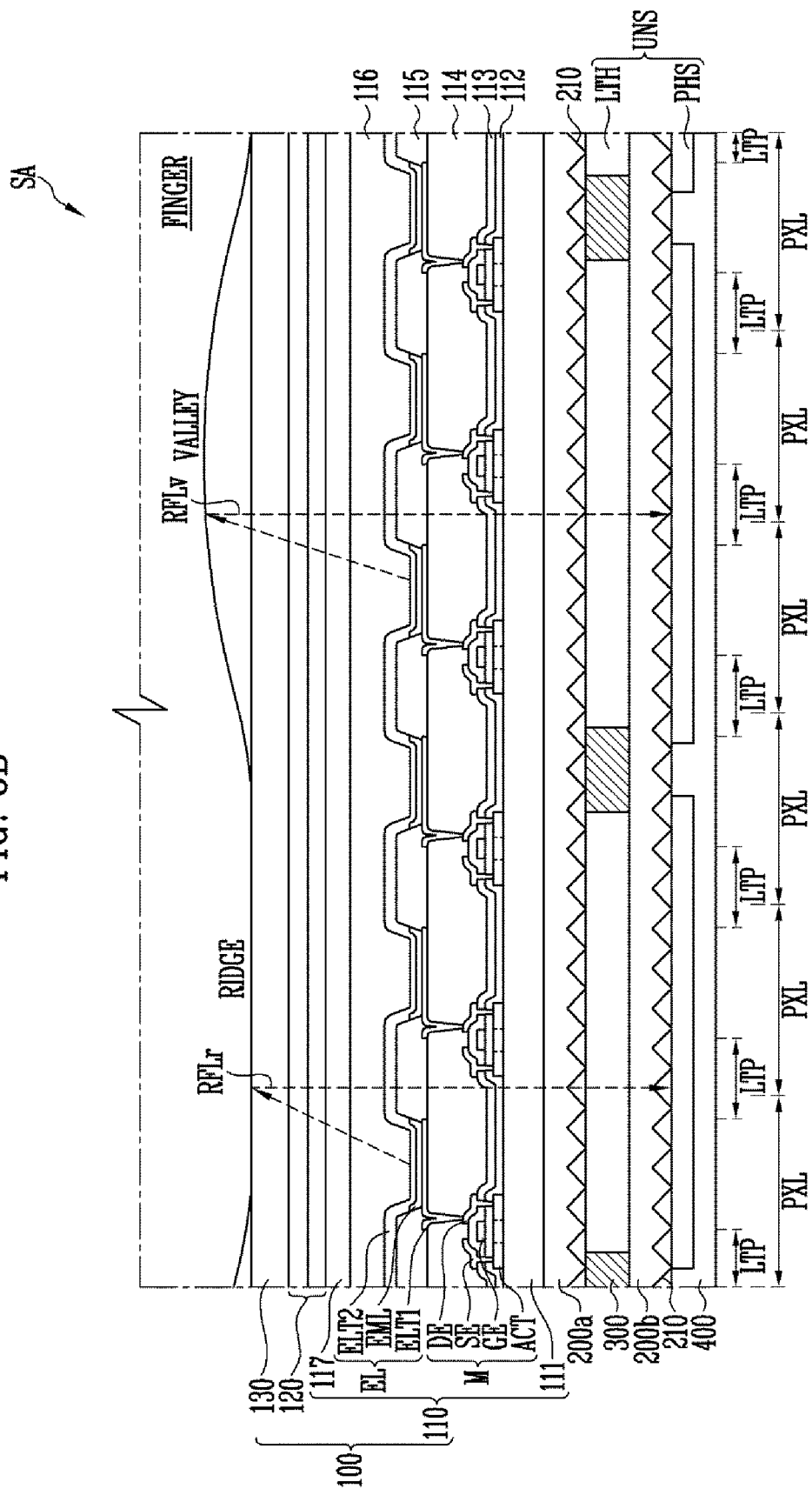

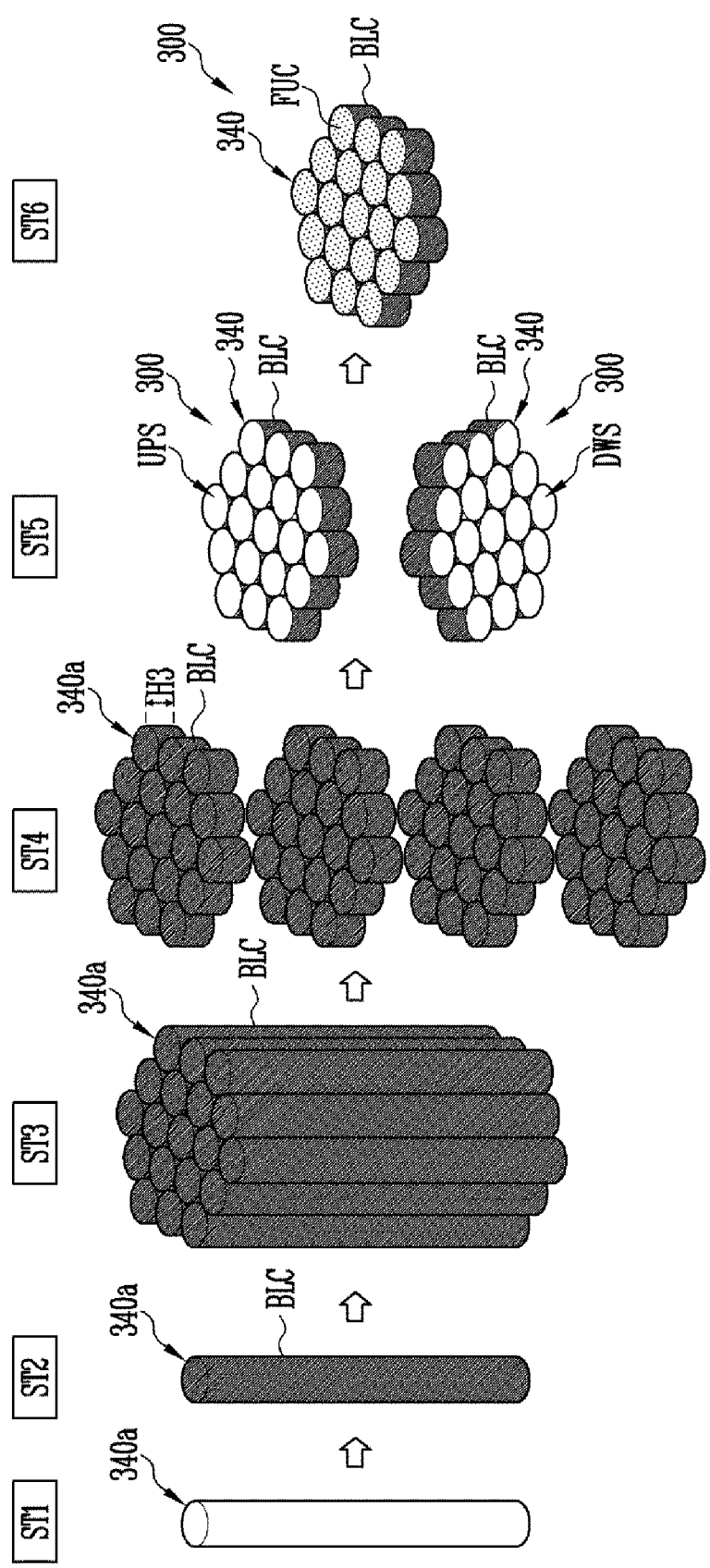

DISPLAY DEVICE

CROSS-REFERENCE TO RELATED APPLICATION

This application is a continuation of U.S. patent application Ser. No. 15/968,646, filed May 1, 2018, which claims priority from and the benefit of Korean Patent Application No. 10-2017-0126298, filed on Sep. 28, 2017, which are hereby incorporated by reference for all purposes as if fully set forth herein.

BACKGROUND

Field

Exemplary embodiments of the invention relate generally to a display device, and more specifically, to a display device embedded with a fingerprint sensor.

Discussion of the Background

Recently, as display devices such as smart phones or tablet PCs have been used for various purposes such as electronic financial transactions, authentication schemes using biological information of a user have been widely utilized. Among various biological information authentication schemes, the most commonly used scheme is an authentication scheme using fingerprints. For this scheme, a fingerprint sensor is attached to a specific region of a display panel, and thus a fingerprint sensing function may be provided.

Fingerprint sensors may be implemented with photosensitive means or the like. For example, photosensitive fingerprint sensor may include a separate light source, a lens, and a photosensor. When such a fingerprint sensor is attached to a display panel, the thickness of a display device may increase, and manufacturing costs of the display device may also increase.

The above information disclosed in this Background section is only for understanding of the background of the inventive concepts, and, therefore, it may contain information that does not constitute prior art.

SUMMARY

Various exemplary embodiments of the present disclosure are directed to a display device, which enables a fingerprint sensor to be configured without a separate external light source and which can increase the amount of light received by a photo sensor.

Additional features of the inventive concepts will be set forth in the description which follows, and in part will be apparent from the description, or may be learned by practice of the inventive concepts.

An exemplary embodiment of the invention may provide for a display device. The display device may include a display panel including a display area and a plurality of pixels arranged in the display area, a photosensor layer including a sensing area overlapping the display area and a plurality of photosensors arranged in the sensing area, a light-guiding layer arranged between the display panel and the photosensor layer and configured to include a plurality of light-transmission holes corresponding to the photosensors, respectively, and a light-condensing layer arranged between the display panel and the photosensor layer to overlap the light-guiding layer.

In an exemplary embodiment, the pixels may emit light to a front surface of the display panel, and the photosensor layer may be arranged on a rear surface of the display panel.

In an exemplary embodiment, the light-condensing layer may include at least one of a first light-condensing layer arranged between the display panel and the light-guiding layer and a second light-condensing layer arranged between the light-guiding layer and the photosensor layer.

In an exemplary embodiment, the light-condensing layer may include a plurality of condensing patterns that protrude in a direction towards the photosensor layer.

In an exemplary embodiment, the light-condensing layer may include at least one of a first direction prism sheet that includes a prism pattern extending along a first direction, a second direction prism sheet that includes a prism pattern extending along a second direction crossing the first direction, a dot-shaped prism sheet that includes a dot-shaped prism pattern, and a lens sheet that includes a dot-shaped lens array.

In an exemplary embodiment, the prism pattern may include a protrusion that has a triangular section, an apex angle of which ranges from 60° to 120°, or that has a shape of a curved surface.

In an exemplary embodiment, the light-condensing layer may be configured to be integrated with the display panel.

In an exemplary embodiment, the light-guiding layer may include one or more mask layers, each including a plurality of openings that form the light-transmission holes.

In an exemplary embodiment, the light-guiding layer may include a plurality of protrusion patterns provided on an inner wall of at least a part of the light-transmission holes.

In an exemplary embodiment, the light-guiding layer may include a plurality of mask layers, each including a plurality of openings corresponding to the light-transmission holes, and a light-transmissive middle layer interposed between the mask layers.

In an exemplary embodiment, the mask layers may include openings having an identical size, and are stacked such that the openings of the mask layers completely overlap each other in regions respectively corresponding to the light-transmission holes.

In an exemplary embodiment, the openings of the mask layers may partially overlap each other in regions respectively corresponding to the light-transmission holes.

In an exemplary embodiment, the mask layers may include openings having different sizes, and are configured such that at least certain portions of the openings of the mask layers overlap each other in regions respectively corresponding to the light-transmission holes.

In an exemplary embodiment, the light-guiding layer may include a base substrate on which the mask layers are arranged.

In an exemplary embodiment, at least one of the mask layers may be directly arranged on a first surface of the photosensor layer, and the light-guiding layer and the photosensor layer are configured to be integrated with each other.

In an exemplary embodiment, the light-guiding layer may be implemented as a transparent tube bundle that includes a plurality of transparent tubes forming the light-transmission holes.

In an exemplary embodiment, the light-guiding layer may include a light-shielding film provided on a cylindrical surface of each of the transparent tubes.

In an exemplary embodiment, each of the transparent tubes may include a functional coating film provided on at least one of a top surface and a bottom surface thereof.

In an exemplary embodiment, each of the transparent tubes may be formed of an optical fiber.

In an exemplary embodiment, each of the pixels may include at least one light-emitting element, and at least a part of the photosensors may include a light-receiving unit disposed between emissive regions of at least two adjacent pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 3A, 3B, 3C, 3D, 3E, 3F, and 3G are plan views respectively illustrating a sensing area according to an exemplary embodiment.

FIGS. 6A and 6B are an exploded perspective view and a sectional view illustrating a display device according to an exemplary embodiment.

FIGS. 8A and 8B are an exploded perspective view and a sectional view illustrating a display device according to an exemplary embodiment.

FIG. 14 is a view illustrating a method of manufacturing a light-guiding layer according to the exemplary embodiment of FIGS. 13A and 13B.

DETAILED DESCRIPTION

Figure 1:
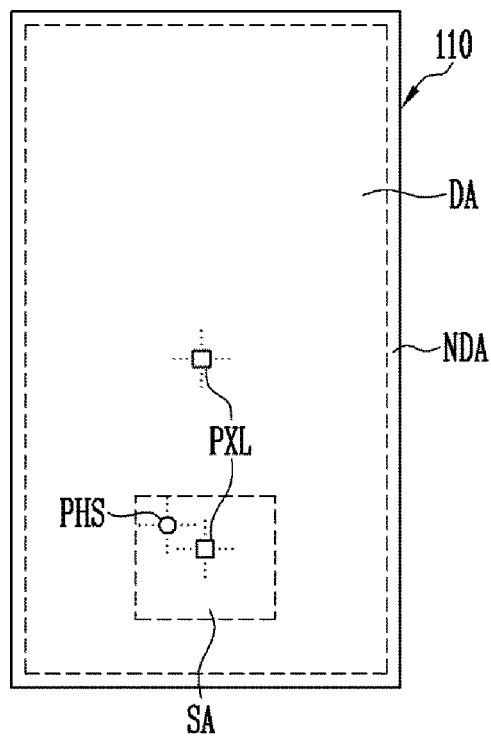
FIGS. 1 and 2 are plan views respectively illustrating a display device according to an exemplary embodiment of the invention.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
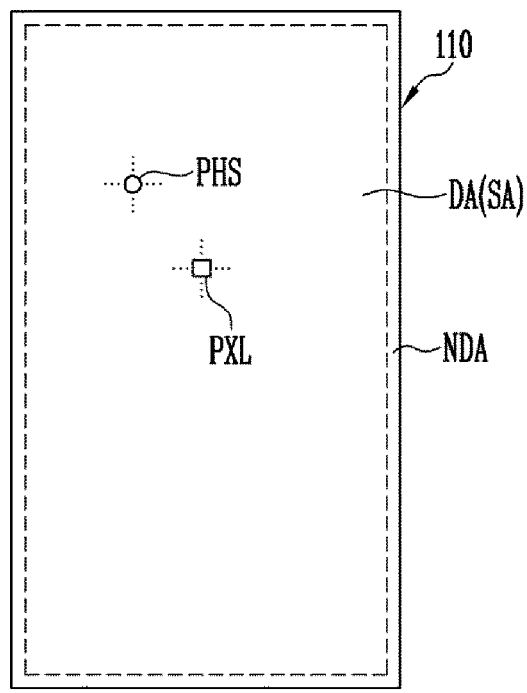

FIGS. 1 and 2 are plan views respectively illustrating a display device according to an exemplary embodiment of the present disclosure. In detail, FIGS. 1 and 2 schematically illustrate a display panel provided in the display device according to an exemplary embodiment of the present disclosure and photosensors arranged to overlap at least a portion of the display panel.

Referring to FIGS. 1 and 2, the display device according to an exemplary embodiment of the present disclosure includes a display panel 110 having a display area DA and a non-display area NDA. In an exemplary embodiment, a portion of the display panel 110 may be set as a sensing area SA in which a fingerprint may be sensed.

In the display area DA, a plurality of pixels PXL are arranged. In an exemplary embodiment, each of the pixels PXL may include at least one light-emitting element. The display device displays an image in the display area DA by driving the pixels PXL in accordance with inputted image data.

In an exemplary embodiment, the display area DA may include a sensing area SA. That is, the display area DA and the sensing area SA may overlap each other, and at least a portion of the display area DA may be set as the sensing area SA.

For example, as illustrated in FIG. 1, only a portion of the display area DA may be set as the sensing area SA or, alternatively, as illustrated in FIG. 2, an entire portion of the display area DA may be set as the sensing area SA. Alternatively, in other exemplary embodiments, the display area DA and the sensing area SA may be arranged adjacent to each other such that only portions thereof overlap each other.

That is, in exemplary embodiments, at least a portion of the display area DA may be set as the sensing area SA, and thus a plurality of pixels PXL may also be arranged in the sensing area SA. Further, in the sensing area SA, a plurality of photosensors PHS may be additionally arranged.

In an exemplary embodiment, the photosensors PHS may be provided on the other surface (e.g., rear surface) opposite to the one surface (e.g., front surface) on which an image is displayed, of both surfaces of the display panel 110. Each of the photosensors PHS may use a light-emitting element, provided in at least one pixel PXL arranged near the corresponding photosensor PHS, as a light source for sensing a fingerprint.

For this operation, the photosensors PHS may overlap at least some of the pixels PXL arranged in the sensing area SA or may be arranged near the pixels PXL. For example, at least some of the photosensors PHS may be arranged to overlap a non-emissive area between adjacent pixels PXL arranged in the sensing area SA.

That is, in an exemplary embodiment of the present disclosure, each of the photosensors PHS may configure each unit sensor together with at least one pixel PXL arranged near it. In addition, the display device according to an exemplary embodiment of the present disclosure may further include a light-guiding layer provided with a plurality of light-transmission holes corresponding to the photosensors PHS, where each light-transmission hole may configure each unit sensor together with a photosensor PHS and a neighboring pixel PXL, which correspond to the light-transmission hole. Such unit sensors may be gathered to constitute a fingerprint sensor.

The non-display area NDA may be an area located near the display area DA, and may mean a remaining area other than the display area DA. In an exemplary embodiment, the non-display area NDA may include a wiring area, a pad area and/or various types of dummy areas.

The display device according to the above-described exemplary embodiment may provide a fingerprint sensing function on the front surface of the display panel 110 using the photosensors PHS configured in the sensing area SA overlapping the display area DA. Further, the display device according to the above-described exemplary embodiment senses a user's fingerprint using light emitted from the pixels PXL. Therefore, a display device embedded with a fingerprint sensor may be configured by using the pixels PXL in the sensing area SA as light sources, without requiring a separate external light source. Accordingly, the thickness of the display device embedded with the fingerprint sensor may be reduced, and manufacturing costs may be decreased.

FIGS. 3A, 3B, 3C, 3D, 3E, 3F, and 3G are plan views respectively illustrating a sensing area according to an exemplary embodiment of the present disclosure. In detail, FIGS. 3A to 3G illustrate different examples related to the sizes and/or array structures of pixels and photosensors arranged in the sensing area. However, the present disclosure is not limited to the exemplary embodiments illustrated in FIGS. 3A to 3G, and the size, number, resolution and/or array relationship of the pixels and/or photosensors arranged in the sensing area may be variously changed.

Figure 3A:
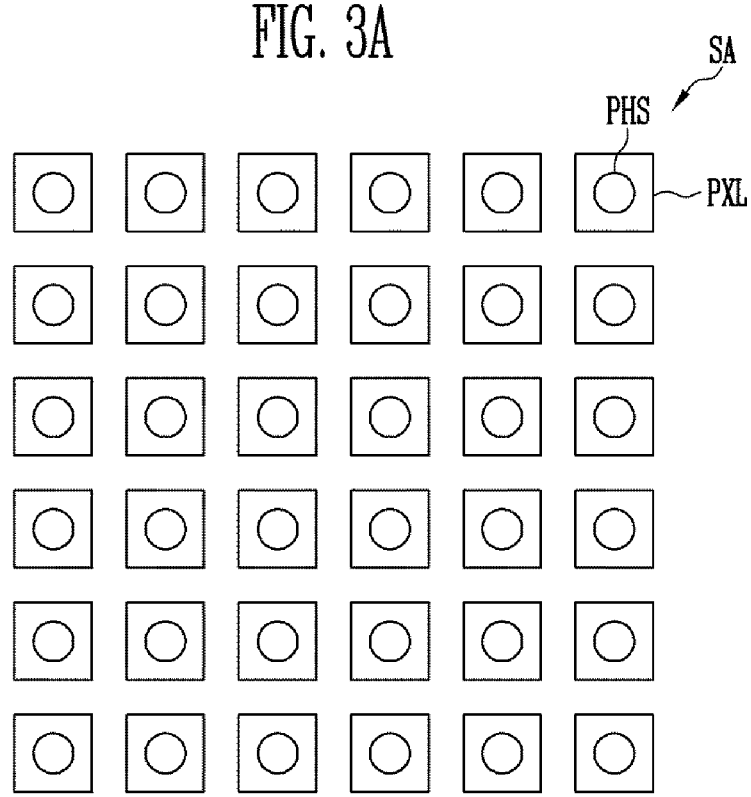

Referring to FIG. 3A, the photosensors PHS may be arranged at the same density as that of pixels PXL in at least the sensing area SA. That is, a number of photosensors PHS identical to the number of pixels PXL may be provided in the sensing area SA. In an exemplary embodiment, at least a portion of each of the photo sensors PHS may overlap at least one pixel PXL. For example, each of the photosensors PHS may be arranged in an area in which a single pixel PXL is formed.

Figure 3B:
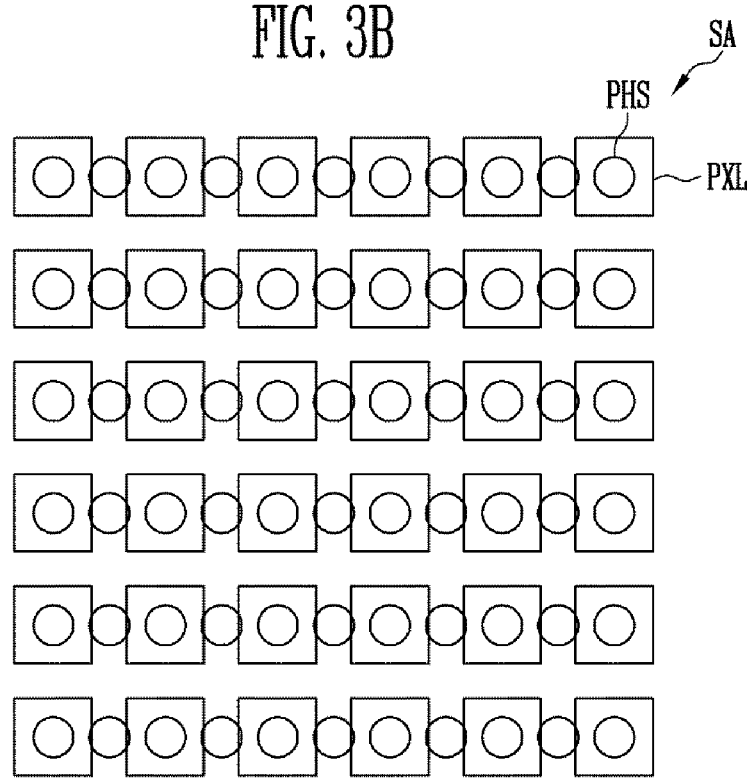

Referring to FIG. 3B, photosensors PHS more than pixels PXL provided in the sensing area SA may be provided and densely arranged in the sensing area SA at a density higher than that of the pixels PXL. Here, each of the photosensors PHS may have a size smaller than that of each individual pixel PXL.

Figure 3C:
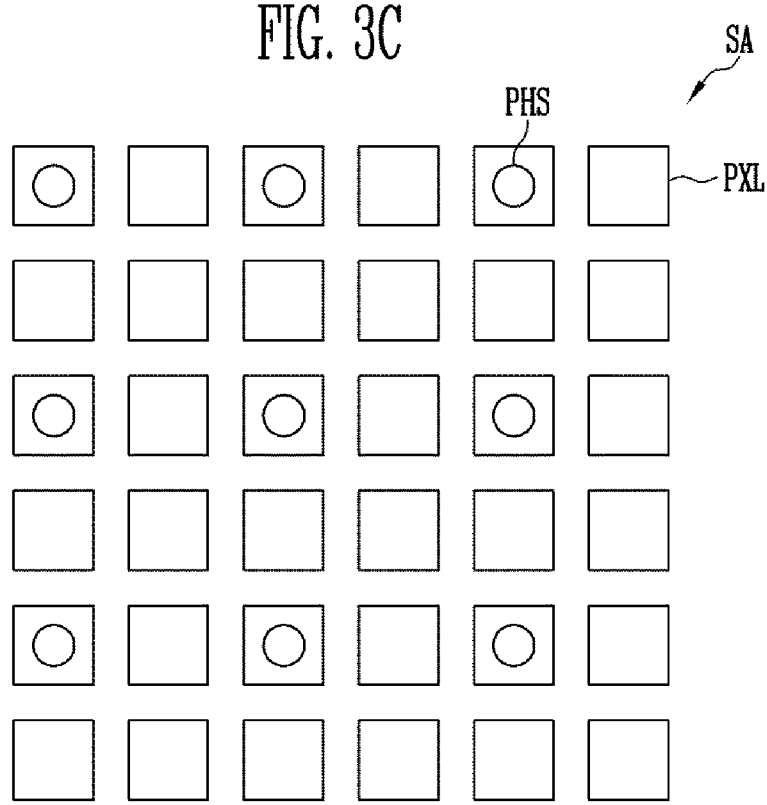

Referring to FIG. 3C, photosensors PHS fewer than pixels PXL may be provided and arranged at predetermined intervals in the sensing area SA. For example, the photosensors PHS may be arranged in an area in which some pixels PXL, among the pixels PXL arranged in the sensing area SA, are formed. Although, for convenience of description, an exemplary embodiment in which one photosensor PHS is arranged every four pixels PXL arranged in the sensing area SA is illustrated in FIG. 3C, the present disclosure is not limited to such an exemplary embodiment. That is, the number (or density) of photosensors PHS arranged in the sensing area SA may be variously changed.

Figure 3D:
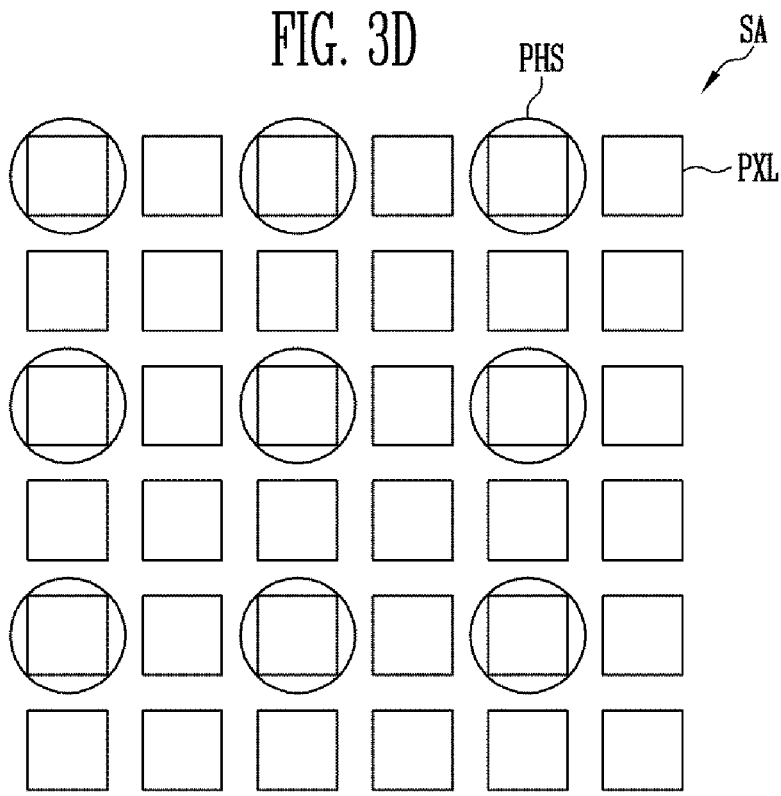

Referring to FIG. 3D, each of photosensors PHS may have a size greater than that of each individual pixel PXL, and may be arranged in an area including an area in which pixels PXL corresponding to respective photosensors PHS are formed. In this case, photosensors PHS fewer than pixels PXL may be provided and arranged at predetermined intervals in the sensing area SA.

Figure 3E:
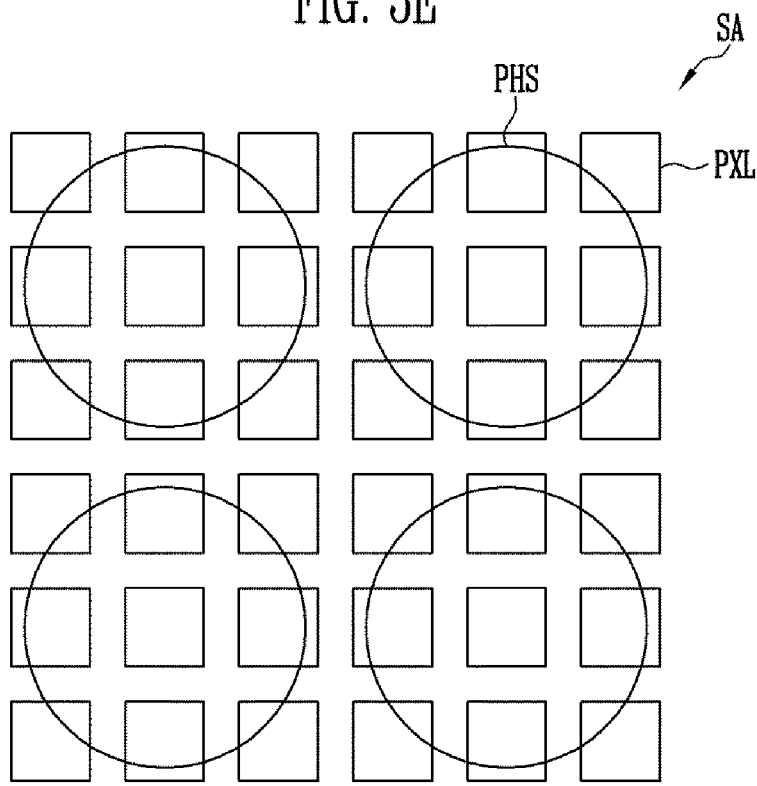

Referring to FIG. 3E, each of photosensors PHS may have a size sufficient to cover a plurality of pixels PXL, and may be arranged to overlap the plurality of pixels PXL.

Figure 3F:
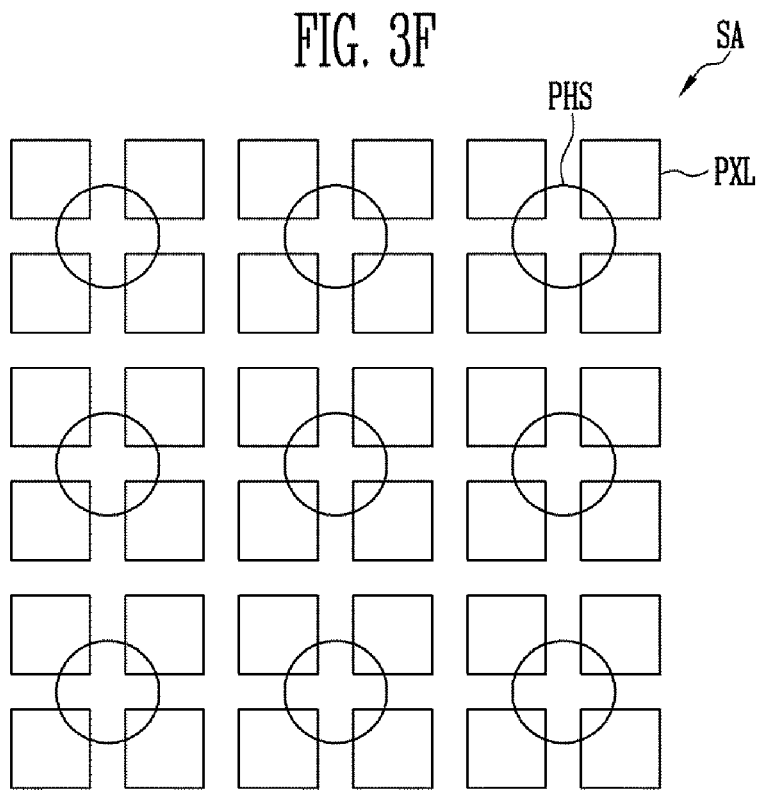

Referring to FIG. 3F, each of photosensors PHS may be arranged in a region between a plurality of adjacent pixels PXL, and may be arranged such that at least a portion of the photosensor PHS overlaps the adjacent pixels PXL.

Referring to FIG. 3G, each of photosensors PHS may be arranged in a gap between adjacent pixels PXL so that the photosensor PHS does not overlap the pixels PXL.

In accordance with the above-described exemplary embodiments, the size, number, density, and location of the photosensors PHS arranged in the sensing area SA and/or the array structure of the photosensors PHS with the pixels PXL may be changed and implemented in various ways. For example, the size, number, density, and location of the photosensors PHS arranged in the sensing area SA and/or the array structure of the photosensors PHS with the pixels PXL may be determined in consideration of various factors, such as a received light amount, density, and/or crosstalk which are required for fingerprint sensing.

In addition, in FIGS. 3A to 3G, an exemplary embodiment in which the photosensors PHS are arranged in the sensing area SA in the form of a regular array is illustrated, but the present disclosure is not limited to such an exemplary embodiment. For example, in other exemplary embodiments of the present disclosure, the photosensors PHS may be irregularly distributed to the sensing area SA.

FIGS. 4A, 4B, 4C, and 4D are circuit diagrams respectively illustrating an example of a pixel according to an exemplary embodiment of the present disclosure. For convenience of description, a certain pixel arranged in an i-th (where i is a natural number) horizontal line (horizontal pixel array) and a j-th (where j is a natural number) vertical line (vertical pixel array) is illustrated in FIGS. 4A to 4D.

Figure 4A:
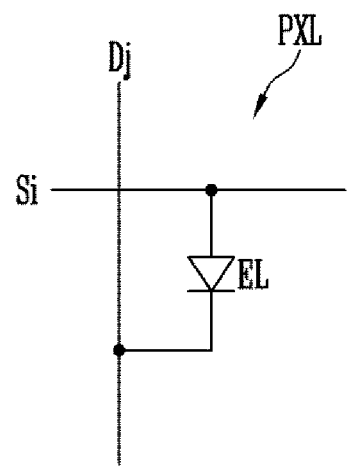
FIGS. 4A, 4B, 4C, and 4D are circuit diagrams respectively illustrating an example of a pixel according to an exemplary embodiment.
Figure 4B:
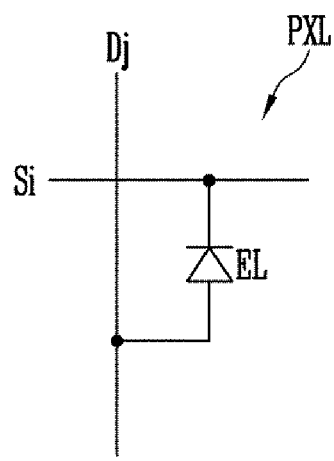

Referring to FIGS. 4A and 4B, according to an exemplary embodiment, each pixel PXL includes at least one light-emitting element EL coupled between a scan line Si and a data line Dj. In an exemplary embodiment, the light-emitting element EL may be, but is not limited to, an organic light-emitting diode (OLED).

In an exemplary embodiment, as illustrated in FIG. 4A, a first electrode, for example, an anode electrode, of the light-emitting element EL may be coupled to the scan line Si, and a second electrode, for example, a cathode electrode, of the light-emitting element EL may be coupled to the data line Dj. However, the coupling direction of the light-emitting element EL may be changed. For example, as illustrated in FIG. 4B, the anode electrode of the light-emitting element EL may be coupled to the data line Dj, and the cathode electrode of the light-emitting element EL may be coupled to the scan line Si.

The above-described pixel PXL may receive a scan signal and a data signal from the scan line Si and the data line Dj, respectively, and may emit light in response to the received signals. For example, when a forward voltage equal to or greater than a threshold voltage is applied between the first and second electrodes thereof, the light-emitting element EL may emit light at luminance corresponding to the magnitude of the voltage. Therefore, light emission of each pixel PXL may be controlled by controlling the voltages of the scan signal and/or the data signal.

Figure 4C:
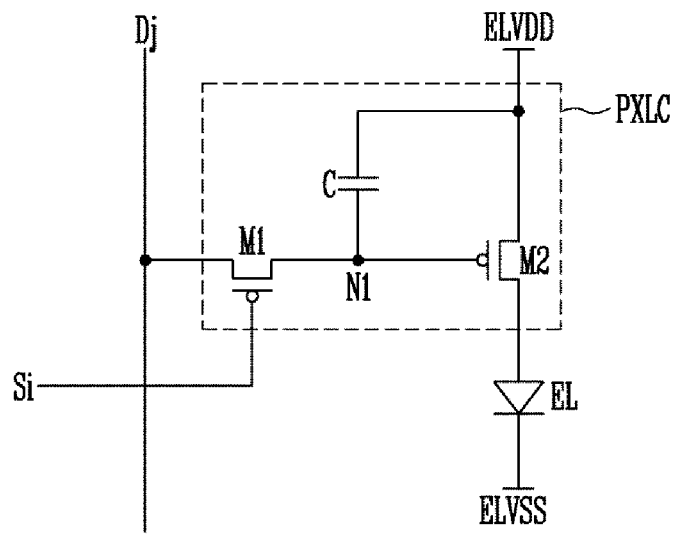
Figure 4D:
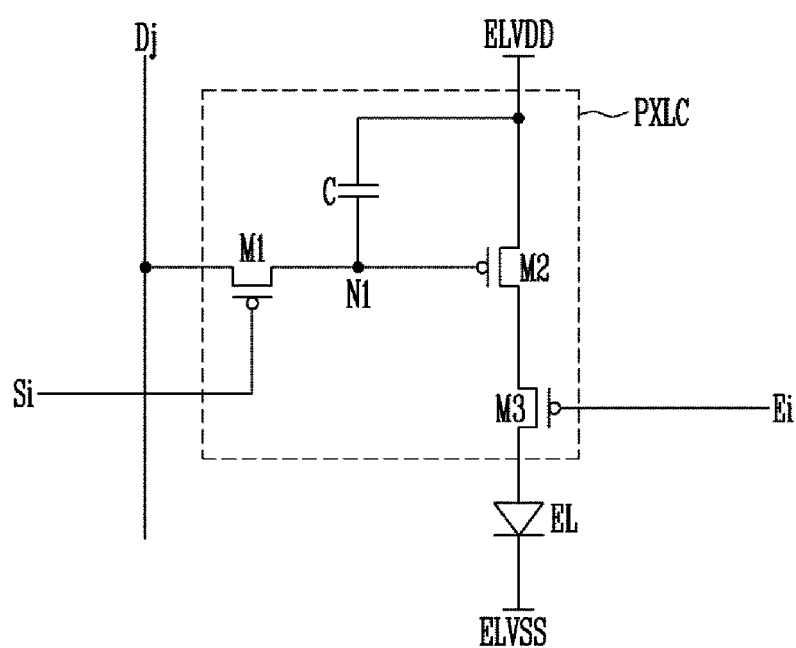

Referring to FIGS. 4C and 4D, in accordance with an exemplary embodiment, each pixel PXL may include a light-emitting element EL coupled between a first power source ELVDD and a second power source ELVSS and a pixel circuit PXLC coupled between the first power source ELVDD and the light-emitting element EL and further coupled to a scan line Si and a data line Dj. Here, the location of the pixel circuit PXLC is not limited thereto. For example, in other exemplary embodiments, the pixel circuit PXLC may also be coupled between the light-emitting element EL and the second power source ELVSS.

In an exemplary embodiment, the first power source ELVDD and the second power source ELVSS have different potentials. For example, the first power source ELVDD may be set to a high-potential power source, and the second power source ELVSS may be set to a low-potential power source. A potential difference between the first power source ELVDD and the second power source ELVSS, that is, a voltage applied therebetween, may be greater than the threshold voltage of the light-emitting element EL.

The light-emitting element EL is coupled to the first power source ELVDD (or the second power source ELVSS) via the pixel circuit PXLC. Such a light-emitting element EL emits light at luminance corresponding to a driving current supplied from the pixel circuit PXLC.

In an exemplary embodiment, as illustrated in FIG. 4C, the pixel circuit PXLC may include first and second transistors M1 and M2 and a capacitor C.

The first transistor (e.g., switching transistor) M1 is coupled between the data line Dj and a first node N1. Further, a gate electrode of the first transistor M1 is coupled to the scan line Si. The first transistor M1 may be turned on when a scan signal is supplied to the scan line Si, and may then electrically couple the data line Dj to the first node N1. Therefore, when the first transistor M1 is turned on, a data signal supplied to the data line Dj is transferred to the first node N1.

The second transistor (e.g., driving transistor) M2 is coupled between the first power source ELVDD and the light-emitting element EL. Further, a gate electrode of the second transistor M2 is coupled to the first node N1. The second transistor M2 controls a driving current flowing into the light-emitting element EL in response to the voltage of the first node N1. For example, the second transistor M2 may control the supply/non-supply of the driving current and/or the magnitude of the driving current in response to the voltage of the first node N1.

The capacitor C is coupled between the first power source ELVDD and the first node N1. The capacitor C stores a voltage corresponding to the data signal supplied to the first node N1 and maintains the stored voltage until a data signal corresponding to a subsequent frame is supplied.

In an exemplary embodiment, the pixel circuit PXLC may further include at least one circuit element. For example, the pixel circuit PXLC may further include a third transistor (e.g., emission control transistor) M3, as illustrated in FIG. 4D.

The third transistor M3 is disposed on a current path through which the driving current flows into the light-emitting element EL. For example, the third transistor M3 may be coupled between the second transistor M2 and the light-emitting element EL. Alternatively, in other exemplary embodiments, the third transistor M3 may also be coupled between the first power source ELVDD and the second transistor M2. A gate electrode of the third transistor M3 is coupled to an emission control line Ei.

In an exemplary embodiment, an emission control signal for controlling the emission time point (or emission period) of the pixel PXL during each frame period may be supplied to the emission control line Ei. For example, during a period in which the scan signal is supplied to the scan line Si, an emission control signal corresponding to a gate-off voltage for turning off the third transistor M3 may be supplied to the emission control line Ei, and an emission control signal corresponding to a gate-on voltage for turning on the third transistor M3 may be supplied to the emission control line Ei after the data signal for each frame has been stored in the pixel PXL.

When the third transistor M3 is provided, light emission of pixels PXL may be easily controlled. For example, during a period in which a fingerprint sensing mode is executed, the light emission of the pixels PXL may be easily controlled.

Meanwhile, in the present disclosure, the structure of each pixel PXL is not limited to the exemplary embodiments disclosed in FIGS. 4A to 4D. For example, the pixel circuit PXLC may be configured using various well-known structures.

Figure 5A:
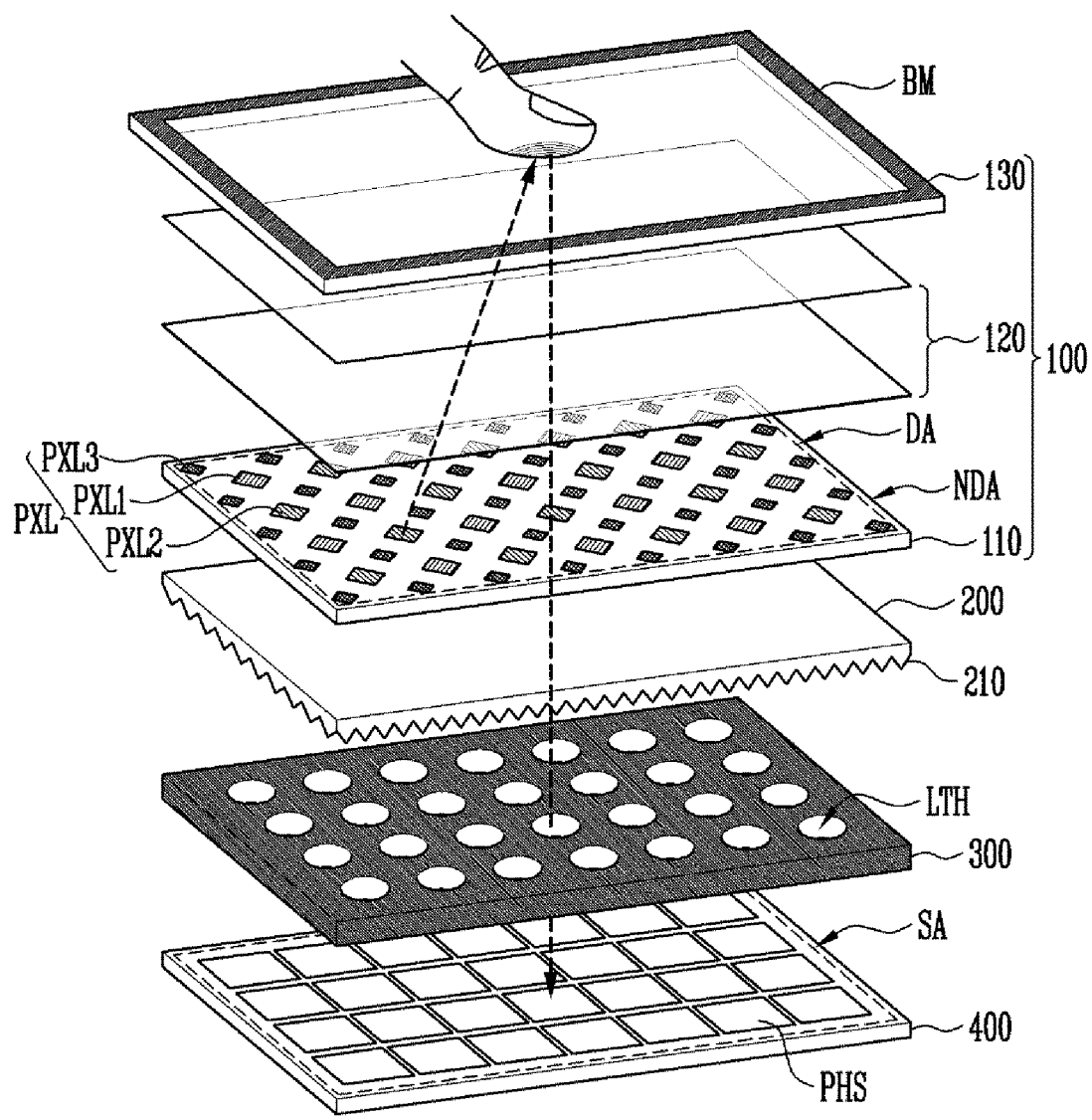
FIGS. 5A and 5B are an exploded perspective view and a sectional view illustrating a display device according to an exemplary embodiment.
Figure 5B:
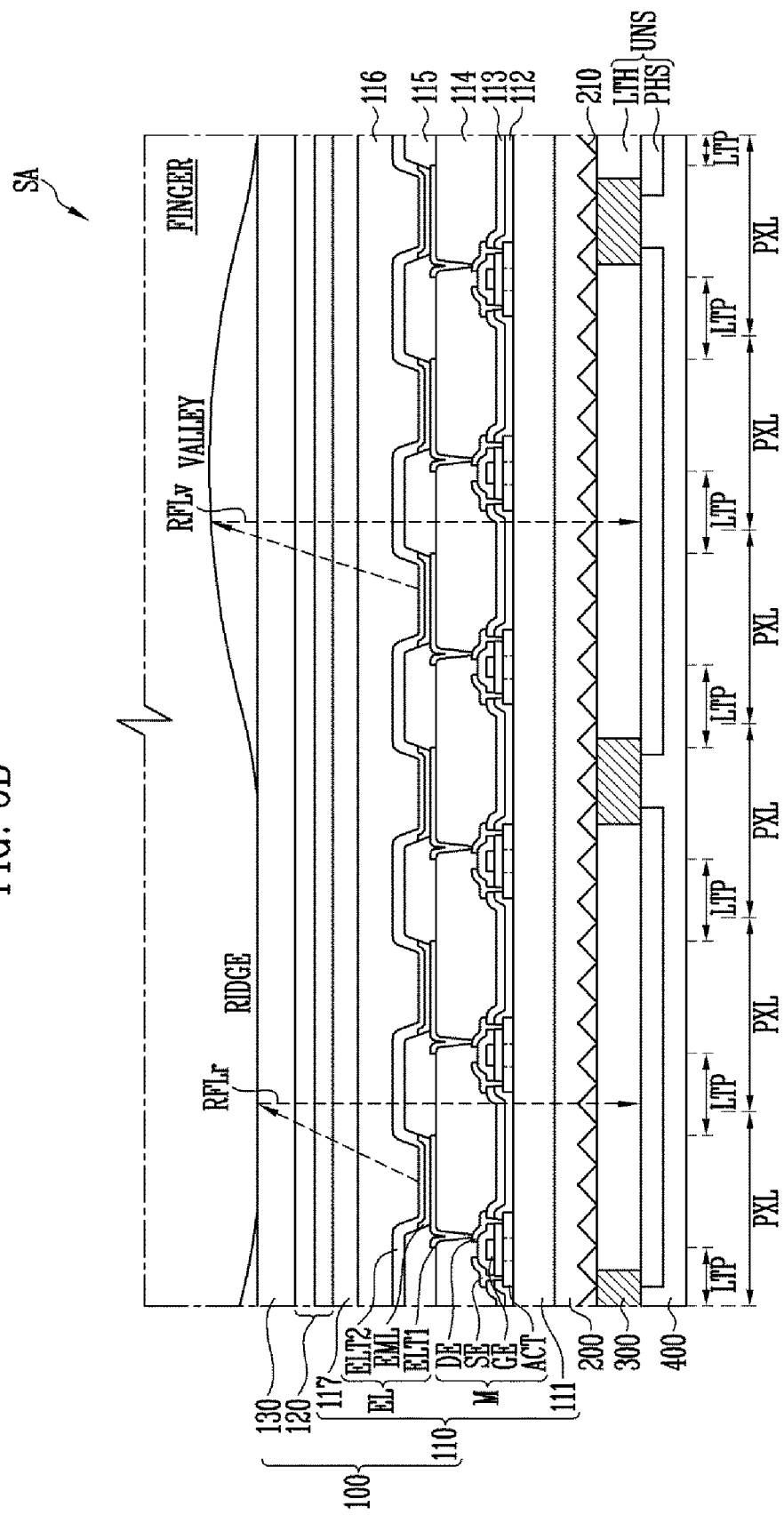

FIG. 5A is an exploded perspective view illustrating a display device according to an exemplary embodiment of the present disclosure. Further, FIG. 5B is a sectional view illustrating a display device, especially a sensing area, according to an exemplary embodiment of the present disclosure. In an exemplary embodiment, in FIGS. 5A and 5B, a display device in which an entire portion of a display area is configured as a sensing area is illustrated.

Referring to FIGS. 5A and 5B, the display device according to an exemplary embodiment of the present disclosure includes a display module 100 having a display panel 110, a photosensor layer 400 arranged on one surface of the display panel 110, and a light-condensing layer 200 and a light-guiding layer 300 arranged between the display panel 110 and the photosensor layer 400 to overlap each other.

In an exemplary embodiment, the display module 100 includes at least the display panel 110, and may further include one or more functional layers 120 and/or a window 130, which are arranged on an image display surface (e.g., a front surface) of the display panel 110, in addition to the display panel 110. However, according to an exemplary embodiment, at least one of the functional layers 120 and the window 130 may be omitted or may be integrated with the display panel 110.

The display panel 110 includes a plurality of pixels PXL arranged in a display area DA. In an exemplary embodiment, the pixels PXL may include, but are not limited to, a first pixel PXL1 for emitting light having a first color (e.g., red), a second pixel PXL2 for emitting light having a second color (e.g., blue), and a third pixel PXL3 for emitting light having a third color (e.g., green). These pixels PXL may be distributed to the display area DA based on a predetermined rule. For example, the pixels PXL may be distributed to the display area DA in a pentile type, but may also be distributed to the display area DA in other various shapes.

In detail, the display panel 110 includes a first substrate 111 and a second substrate 117 (or an encapsulation layer) arranged over one surface (e.g., an image display surface) of the first substrate 111. That is, the first substrate 111 and the second substrate 117 may face each other.

In an exemplary embodiment, at least one of the first substrate 111 and the second substrate 117 may be, but is not limited to, a glass substrate or a plastic substrate. For example, the first substrate 111 and/or the second substrate 117 may be a flexible substrate including a material corresponding to at least one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). Further, the first substrate 111 and/or the second substrate 117 may be a rigid substrate including any one of glass and tempered glass. That is, the first substrate 111 and/or the second substrate 117 may be a substrate made of a transparent material, that is, a light-transmissive substrate.

Further, in an exemplary embodiment, at least one of the first substrate 111 and the second substrate 117 may be composed of one or more insulating layers that include at least one inorganic layer and/or organic layer or an organic/inorganic hybrid layer. For example, the second substrate 117 may be a thin-film encapsulation (TFE) layer including one or more insulating layers that include at least one inorganic layer and/or organic layer or an organic/inorganic hybrid layer.

In an exemplary embodiment, a plurality of pixels PXL may be arranged between the first substrate 111 and the second substrate 117. In an exemplary embodiment, each of the pixels PXL may include at least one light-emitting element EL. Further, in an exemplary embodiment, each of the pixels PXL may further include at least one transistor M coupled to the light-emitting element EL.

For example, each of the pixels PXL may include a transistor M disposed on one surface (e.g., top surface) of the first substrate 111 and a light-emitting element EL electrically coupled to the transistor M. In an exemplary embodiment, the transistor M may include an active layer ACT, a gate electrode GE, and source and drain electrodes SE and DE. In an exemplary embodiment, the active layer ACT may be arranged on the first substrate 111, and the gate electrode GE may be arranged to overlap the active layer ACT, with a first insulating layer 112 interposed between the gate electrode GE and the active layer ACT. In an exemplary embodiment, the source and drain electrodes SE and DE may be arranged on a second insulating layer 113 disposed on the gate electrode GE, and may then be coupled to the active layer ACT through contact holes formed in the first and second insulating layers 112 and 113. Meanwhile, the structure of the transistor M is not limited to such exemplary embodiments, and the transistor may be implemented in various well-known structures.

In an exemplary embodiment, a third insulating layer 114 may be arranged on the source and drain electrodes SE and DE, and the light-emitting element EL may be arranged on the third insulating layer 114. The light-emitting element EL may be electrically coupled to the transistor M through via holes formed in the third insulating layer 114.

The light-emitting element EL may include a first electrode ELT1 and a second electrode ELT2 that overlap each other in at least a certain region, and an emissive layer EML interposed between the first and second electrodes ELT1 and ELT2. In an exemplary embodiment, the first electrode ELT1 and the second electrode ELT2 may be, but are not limited to, an anode electrode and a cathode electrode, respectively. For example, according to the pixel structure, the first electrode ELT1 electrically coupled to the transistor M may be the cathode electrode. In an exemplary embodiment, a pixel-defining layer 115 may be arranged between light-emitting units of pixels PXL (e.g., regions in which the first electrode ELT1 and the emissive layer EML of the light-emitting element EL are provided). Further, a fourth insulating layer 116 may be interposed between the light-emitting element EL and the second substrate 117.

In an exemplary embodiment, the display panel 110 may be implemented such that at least a portion thereof is transparent or semi-transparent, thus allowing light to pass therethrough. For example, the display panel 110 may include pixels PXL and/or light-transmission regions LTP arranged near the pixels PXL.

In an exemplary embodiment, the light-transmission regions LTP may be configured below the pixels PXL, as well as on the pixels PXL. For example, the light-transmission regions LTP may be present even gaps in which light-shielding elements, such as circuit elements constituting each pixel PXL and/or wires coupled to the circuit elements, are not arranged. That is, the light-transmission regions LTP allowing light to pass therethrough may be distributed to the inside of the display area DA.

More specifically, each light-transmission region LTP may not only include a region in which only transparent elements (e.g., insulating layers or the like), among regions of the display panel 110, are arranged, but also inclusively mean a region which has a transmissivity of greater than 0% and is capable of transmitting at least a part of light generated from the display panel 110 or light incident on the display panel 110, among regions in which opaque or semi-transparent elements are arranged. For example, the light-transmission regions LTP may be configured in gaps in which light-shielding elements are not arranged, among regions between the light-emitting units of the pixels PXL, for example, regions in which the pixel-defining layer 115 is provided.

The functional layers 120 may include a polarizing layer, a touch sensor layer, an adhesive layer and/or a protective layer, but the configuration of the functional layers 120 is not especially limited. In an exemplary embodiment, the functional layers 120 may be omitted or may be integrated with the display panel 110. For example, the functional layers 120 may be directly formed or provided on the second substrate 117.

The window 130 may be arranged in an uppermost portion of the display module 100. In an exemplary embodiment, an opaque pattern for hiding the non-display area NDA of the display panel 110, for example, a black matrix BM, may be provided on the border of the window 130.

The light-condensing layer 200, the light-guiding layer 300, and the photosensor layer 400 may be sequentially arranged on the other surface of the display module 100. For example, assuming that the pixels PXL emit light to the front surface of the display panel 110 and then an image is displayed on the front surface of the display panel 110, the light-condensing layer 200, the light-guiding layer 300, and the photosensor layer 400 may be sequentially arranged on the rear surface of the display panel 110.

The light-condensing layer 200 may downwardly condense light, which passes through the display module 100 and is emitted to the rear surface of the display panel 110, to a portion below the light-condensing layer 200, in which the photosensor layer 400 is arranged. For this, the light-condensing layer 200 may have a plurality of protrusions which protrude in a direction towards the photosensor layer 400 and form respective condensing patterns 210. For example, the light-condensing layer 200 may include at least one prism sheet and/or lens sheet, and the condensing patterns 210 may each be implemented as a prism pattern or a spherical lens array (or a spherical prism pattern).

When the light-condensing layer 200 is provided in this way, the amount of light received by the photosensor layer 400 (i.e., received light amount) may be increased. Accordingly, the received light amount of the photosensor layer 400 may be sufficiently secured during a fingerprint sensing period.

The light-guiding layer 300 includes a plurality of light-transmission holes LTH corresponding to the photosensors PHS. For example, the light-guiding layer 300 may be composed of one or more mask layers (or mask sheets), each having a plurality of openings forming the light-transmission holes LTH. Here, a remaining region of the light-guiding layer 300, other than the light-transmission holes LTH, may be made of a light-shielding and/or light-absorbing material. For example, the light-guiding layer 300 may be implemented as a black mask layer provided with openings corresponding to the light-transmission holes LTH.

In an exemplary embodiment, the light-guiding layer 300 may include a plurality of light-transmission holes LTH corresponding to respective light-receiving units of the photosensors PHS, and each light-transmission hole LTH may overlap the light-receiving unit of the photosensor PHS corresponding thereto.

In an exemplary embodiment, assuming that the pixels PXL emit light in the direction of the second substrate 117, that is, the direction of the front surface, the light-transmission holes LTH are configured such that, of light that has been reflected from a user's finger (especially a fingerprint region) and that has been again incident on the display panel 110, reflected light having a predetermined direction and/or an angle falling within a predetermined range may pass through the light-transmission holes LTH. For example, the light-transmission holes LTH may be vertically formed through the light-guiding layer 300 so that, of the reflected light that has been again incident on the display panel 110, light vertically incident on the display panel 110 may selectively pass through the light-transmission holes LTH.

The light-transmission holes LTH may function as a filter for allowing only partial reflected light that matches a predetermined direction and/or a predetermined angle, of all light reflected from the user's finger, to selectively pass therethrough. For example, the light-transmission holes LTH may mainly transmit reflected light that has been diagonally incident on the user's finger (especially a fingerprint region) from at least one pixel PXL and has been reflected from the user's finger in a direction approximately vertical to the display panel 110. In this way, when a fingerprint is sensed using light diagonally emitted to the user's finger, the light and shade of the fingerprint are more distinctive, and thus a fingerprint pattern may be more easily detected. Further, when the light-guiding layer 300 is configured using a light-shielding mask layer including a plurality of openings corresponding to the light-transmission holes LTH, a fingerprint sensor may be implemented without requiring a separate lens, and deterioration of resolution attributable to diffraction of light may be prevented.

Although, for convenience of description, the shape of the light-transmission holes LTH is illustrated as being a cylindrical shape in FIGS. 5A and 5B, the shape, size (e.g., diameter, sectional area and/or height), number and/or array structure of the light-transmission holes LTH may be variously changed. For example, various shapes of light-transmission holes LTH may be formed in the light-guiding layer 300 in consideration of various factors, such as a received light amount and resolution required by each photosensor PHS. For example, in other exemplary embodiments of the present disclosure, light-transmission holes LTH may have other shapes such as the shape of a polyprism or a truncated cone.

The photosensor layer 400 may include a photosensor array composed of a plurality of photosensors PHS. Meanwhile, in an exemplary embodiment, an optical filter (e.g., IR filter) for transmitting or blocking light having a specific wavelength may be additionally arranged on one surface of the photosensor layer 400, in particular, a top surface of the photosensor layer 400 on which the light-receiving units of the photosensors PHS are arranged.

In an exemplary embodiment, each photosensor PHS may form a unit sensor UNS together with the light-transmission hole LTH corresponding thereto. Meanwhile, the display device according to an exemplary embodiment of the present disclosure is a display device embedded with a fingerprint sensor, which senses a fingerprint using the internal light of the display panel 110. The display device senses a fingerprint by causing at least some of pixels PXL in the sensing area SA to emit light during a fingerprint sensing period. Therefore, it may be considered that, together with a pair of a photosensor PHS and a light-transmission hole LTH corresponding to each other, at least one pixel PXL arranged near the pair may configure a unit sensor UNS. In the sensing area SA, a plurality of unit sensors UNS may be arranged, and these unit sensors UNS may be gathered to constitute a fingerprint sensor.

In an exemplary embodiment, each of the photosensors PHS may be, but is not limited to, any one of a photodiode, a complementary metal-oxide-semiconductor (CMOS) image sensor, and a charge-coupled device (CCD) camera. At least some of the photosensors PHS may include a light-receiving unit overlapping a light-transmission region LTP between emissive areas of at least two adjacent pixels PXL, and may generate output signals corresponding to light incident on the light-receiving unit after passing through the light-transmission region LTP and the corresponding light-transmission hole LTH. The output signals generated from the photo sensors PHS may be inputted to a fingerprint detection circuit (not illustrated), and may be used to generate fingerprint information of the user. That is, the display device according to the exemplary embodiment of the present disclosure may sense the fingerprint pattern of a finger placed on the display panel 110 using the output signals from the photosensors PHS.

A method of sensing a fingerprint using the display device according to the above-described exemplary embodiments is described in brief below. During a fingerprint sensing period in which photosensors PHS are enabled, the fingerprint sensing method configures at least some of the pixels PXL in the sensing area SA to emit light, with the user's finger (especially a fingerprint region) touching (or approaching) the sensing area SA. For example, during the fingerprint sensing period, all pixels PXL in the sensing area SA may be configured to simultaneously or sequentially emit light. Alternatively, among the pixels PXL in the sensing area SA, only some pixels PXL may be configured to emit light at predetermined intervals or only some pixels PXL for emitting light having a specific color (e.g., short-wavelength light, such as blue light) may be configured to selectively emit light, and may then be used as light sources for sensing a fingerprint.

Then, a part of light emitted from the pixels PXL may be reflected from the user's finger and may then be incident on the photosensors PHS via light-transmission regions LTP and light-transmission holes LTH. Here, the amounts and/or waveforms of lights (i.e., reflected lights RFLr and RFLv), reflected from a ridge and a valley of the fingerprint, may differ from each other, so that such a difference is detected, and thus the fingerprint shape (fingerprint pattern) of the user may be detected.

Meanwhile, since the display device according to an exemplary embodiment of the present disclosure may further include the light-condensing layer 200 arranged between the display panel 110 and the photosensor layer 400, for example, on the top of the light-guiding layer 300, the received light amount of each photosensor PHS may be increased. Accordingly, the received light amount of the photosensor layer 400 may be sufficiently secured during a fingerprint sensing period, and thus fingerprint sensing performance may be improved.

Figure 6A:
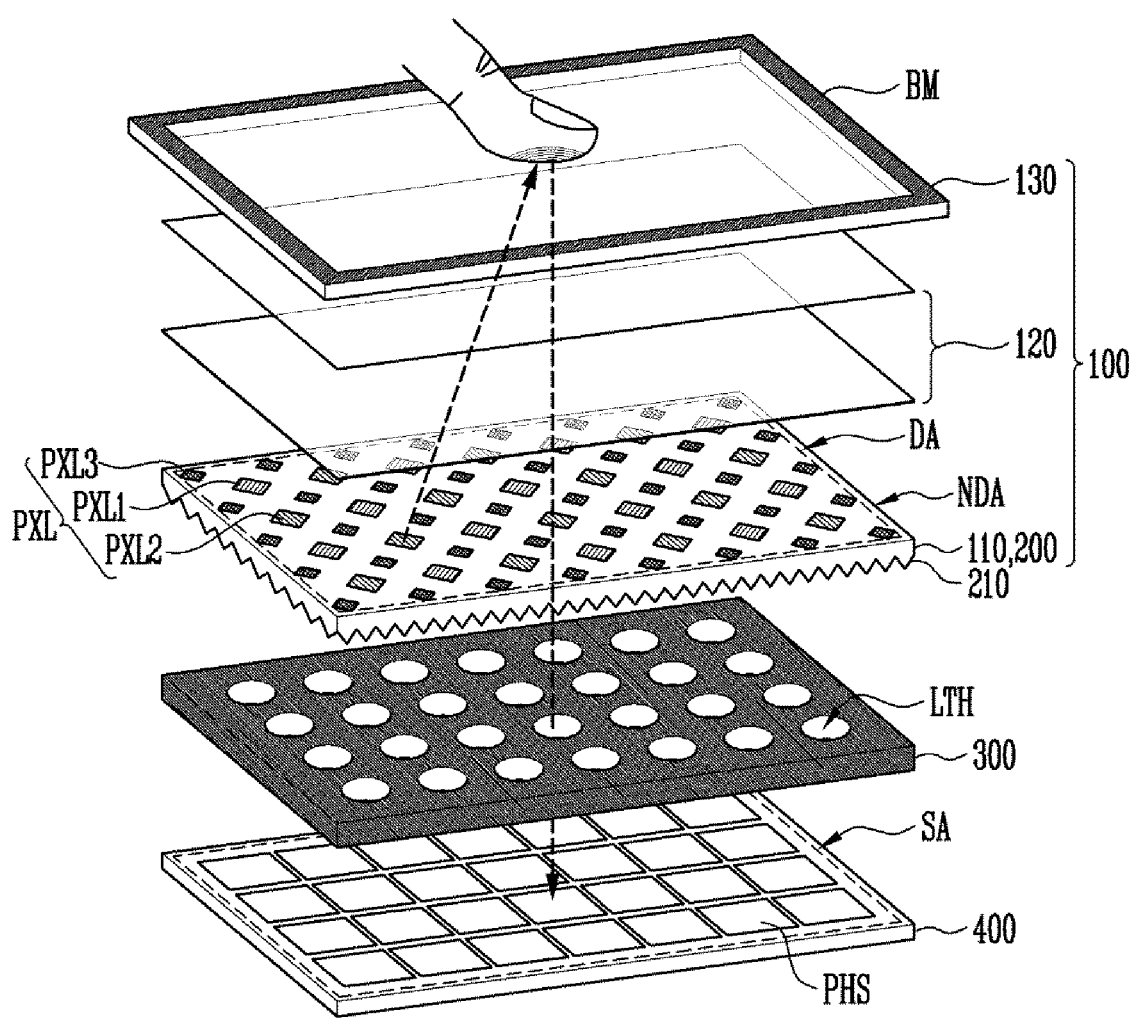

FIGS. 6A and 6B are an exploded perspective view and a sectional view illustrating a display device according to an exemplary embodiment of the present disclosure, and illustrate in detail a modification of the exemplary embodiment of FIGS. 5A and 5B. In FIGS. 6A and 6B, the same reference numerals are used to designate components similar or identical to those in the above-described exemplary embodiments, and thus a detailed description thereof will be omitted.

Referring to FIGS. 6A and 6B, a light-condensing layer 200 may be integrated with a display panel 110. For example, the bottom surface of the display panel 110 (e.g., the rear surface of a first substrate 111) may be formed such that a plurality of condensing patterns 210 are arranged on the bottom surface.

Figure 7A:
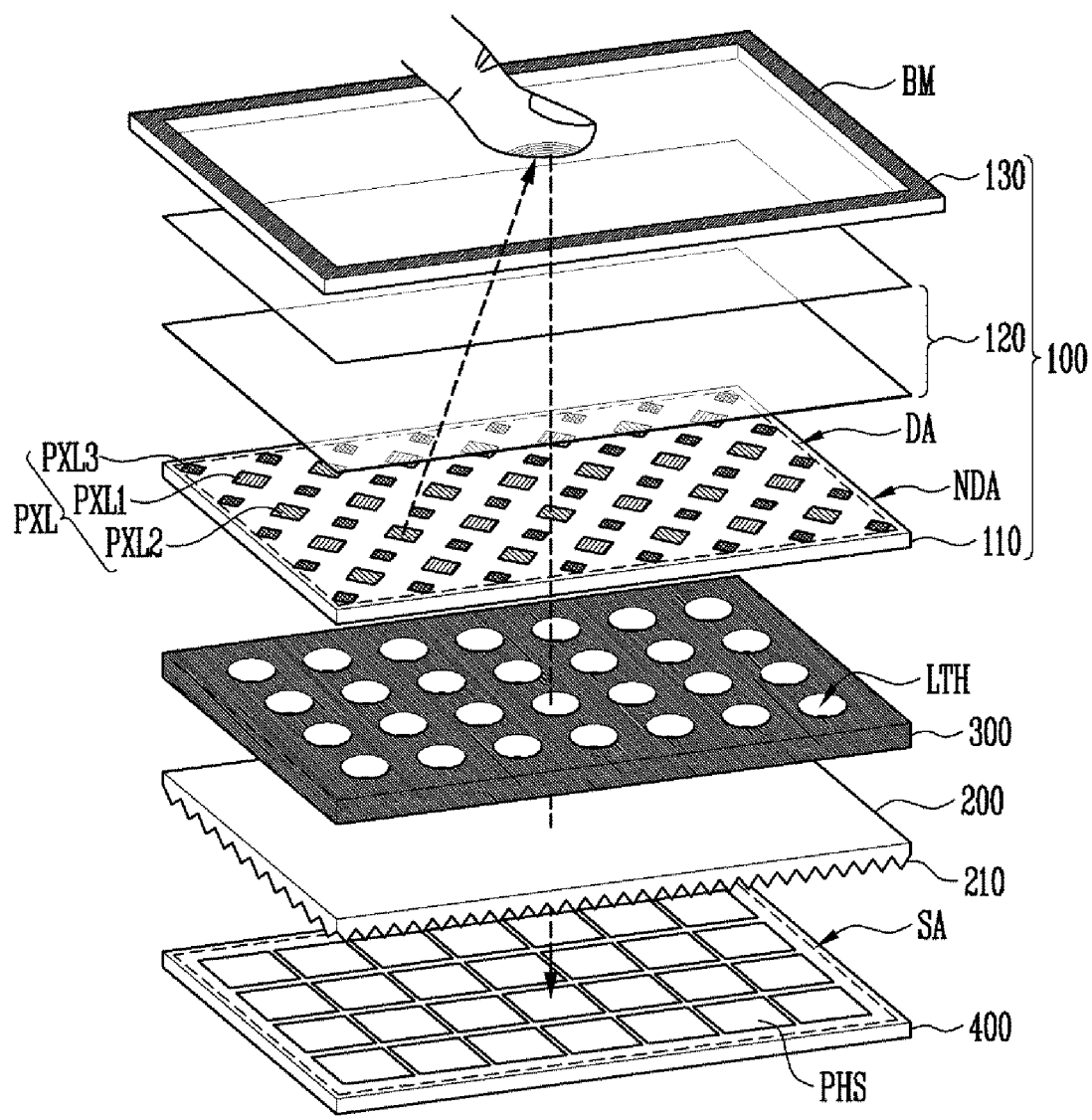
FIGS. 7A and 7B are an exploded perspective view and a sectional view illustrating a display device according to an exemplary embodiment.
Figure 7B:
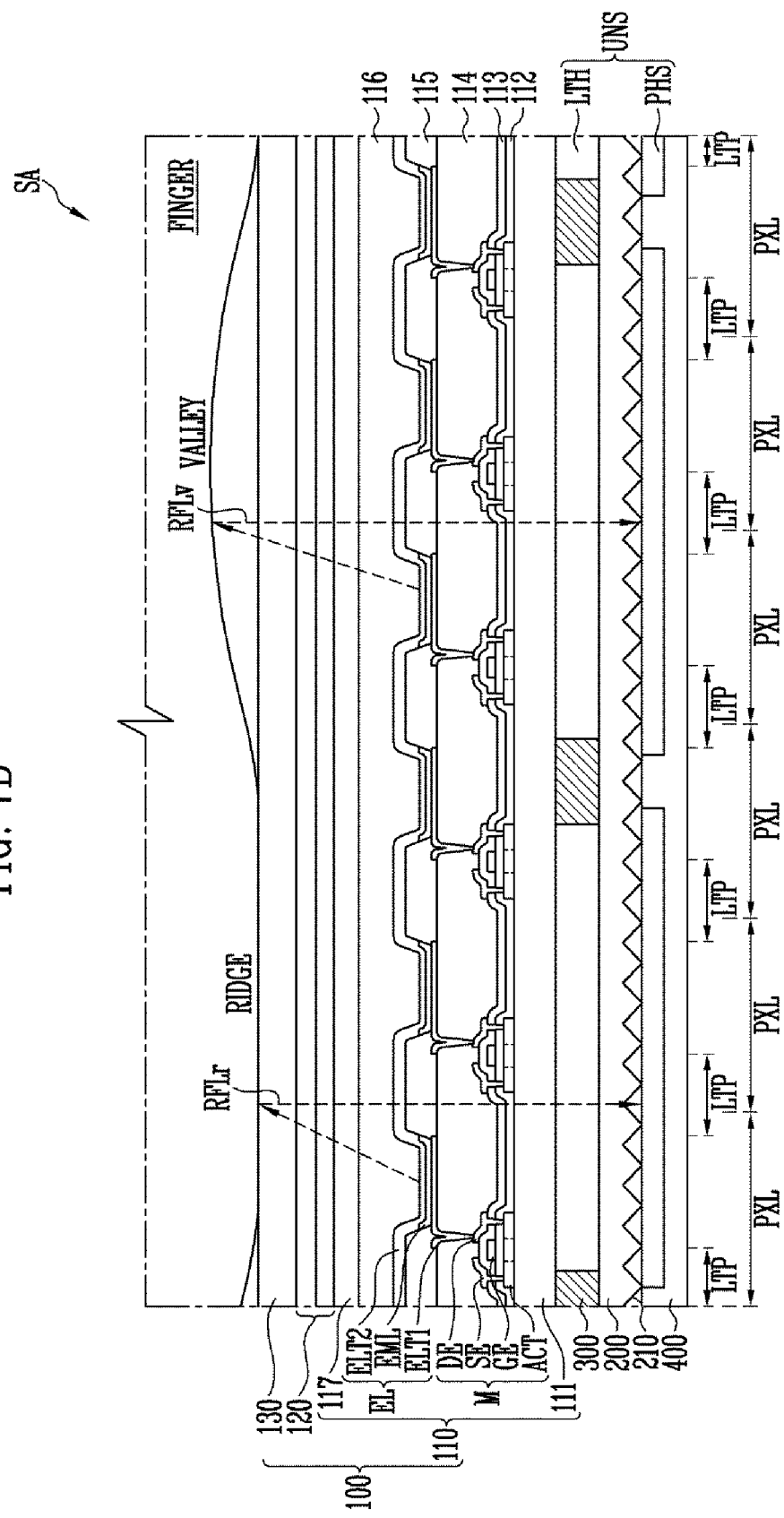

FIGS. 7A and 7B are an exploded perspective view and a sectional view illustrating a display device according to an exemplary embodiment of the present disclosure, and illustrate in detail a modification of the exemplary embodiment of FIGS. 5A and 5B. In FIGS. 7A and 7B, the same reference numerals are used to designate components similar or identical to those in the above-described exemplary embodiments, and thus a detailed description thereof will be omitted.

Referring to FIGS. 7A and 7B, a light-condensing layer 200 may be arranged between a light-guiding layer 300 and a photosensor layer 400. That is, the light-condensing layer 200, which is arranged between a display module 100 and the photosensor layer 400 to overlap the light-guiding layer 300, may be disposed on a path through which light passes through the display module 100 is incident on the photosensor layer 400. Such a light-condensing layer 200 may improve received light amounts of photosensors PHS by condensing light incident from the display module 100 to the photosensors PHS.

Figure 8A:
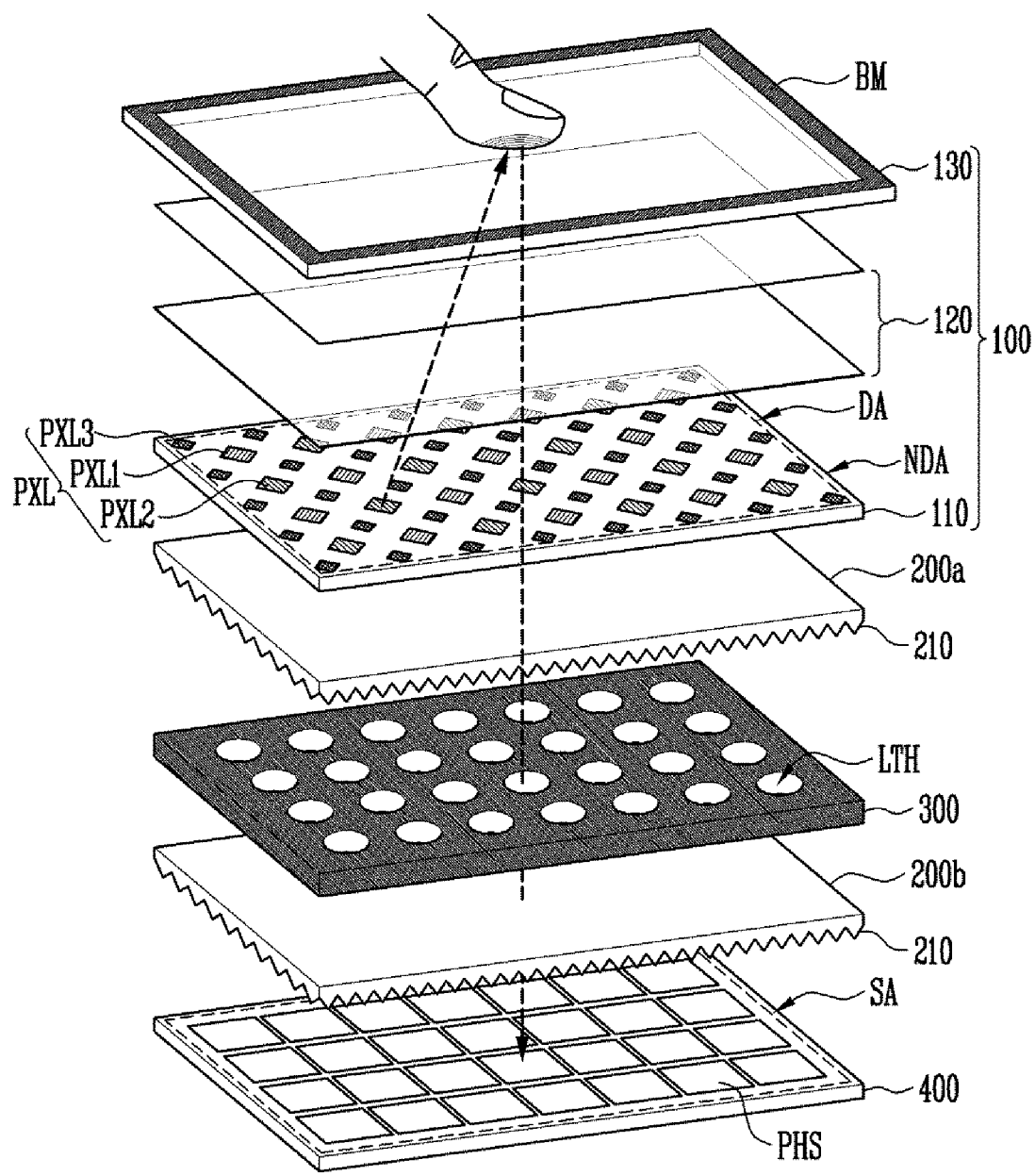

FIGS. 8A and 8B are an exploded perspective view and a sectional view illustrating a display device according to an exemplary embodiment of the present disclosure, and illustrate in detail a modification of the exemplary embodiment of FIGS. 5A and 5B. In FIGS. 8A and 8B, the same reference numerals are used to designate components similar or identical to those in the above-described exemplary embodiments, and thus a detailed description thereof will be omitted.

Referring to FIGS. 8A and 8B, the display device according to an exemplary embodiment of the present disclosure may include a first light-condensing layer 200a arranged between a display panel 110 and a light-guiding layer 300 and a second light-condensing layer 200b arranged between the light-guiding layer 300 and a photosensor layer 400. In an exemplary embodiment, the first light-condensing layer 200a and the second light-condensing layer 200b may include identical types or different types of condensing patterns 210. For example, the first light-condensing layer 200a and/or the second light-condensing layer 200b may include prism pattern-shaped condensing patterns 210 or may include spherical or lenticular condensing patterns 210, each having at least a curved portion.

FIGS. 9A, 9B, 9C, and 9D are perspective views respectively illustrating an example of a light-condensing layer according to an exemplary embodiment of the present disclosure.

Figure 9A:
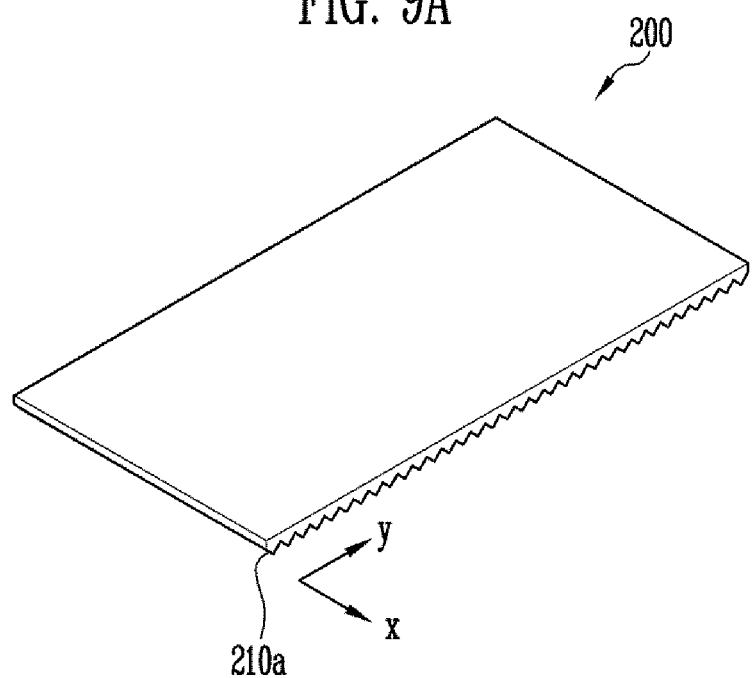
FIGS. 9A, 9B, 9C, and 9D are perspective views respectively illustrating an example of a light-condensing layer according to an exemplary embodiment.
Figure 9B:
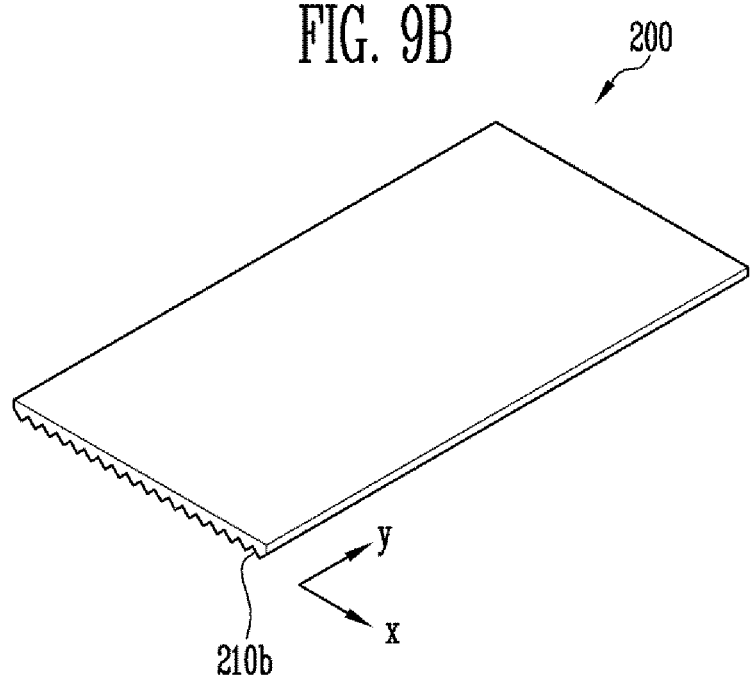

Referring to FIGS. 9A and 9B, a light-condensing layer 200 may be configured using at least one prism sheet (or at least one prism pattern layer) that includes a plurality of prism patterns 210a and 210b extending along any direction. For example, the light-condensing layer 200 may include at least one of an x-direction prism sheet (or an x-direction prism pattern layer) including a prism pattern 210a in which prism mountains (protrusions of the prism sheet) are extended along an x direction, as illustrated in FIG. 9A, and a y direction prism sheet (or a y-direction prism pattern layer) including a prism pattern 210b in which prism mountains are extended along a y direction, as illustrated in FIG. 9B. For example, the light-condensing layer 200 may be implemented as an independent x-direction or y-direction prism sheet, or as a multilayer structure in which the x-direction prism sheet and the y-direction prism sheet are stacked.

Figure 9C:
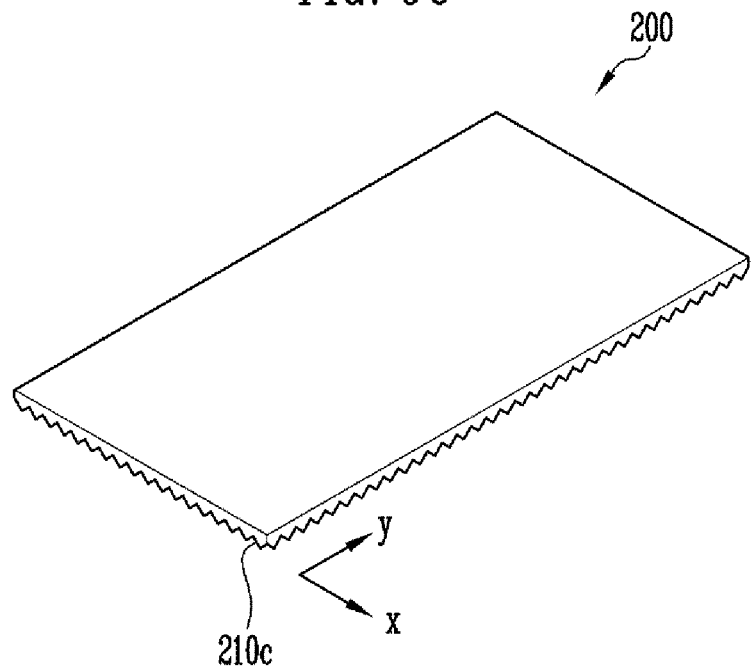

Referring to FIG. 9C, the light-condensing layer 200 may include at least one dot-shaped prism sheet (or at least one dot-shaped prism pattern layer) including a dot-shaped prism pattern 210c. For example, the light-condensing layer 200 may include a pyramidal dot-shaped prism pattern 210c.

Figure 9D:
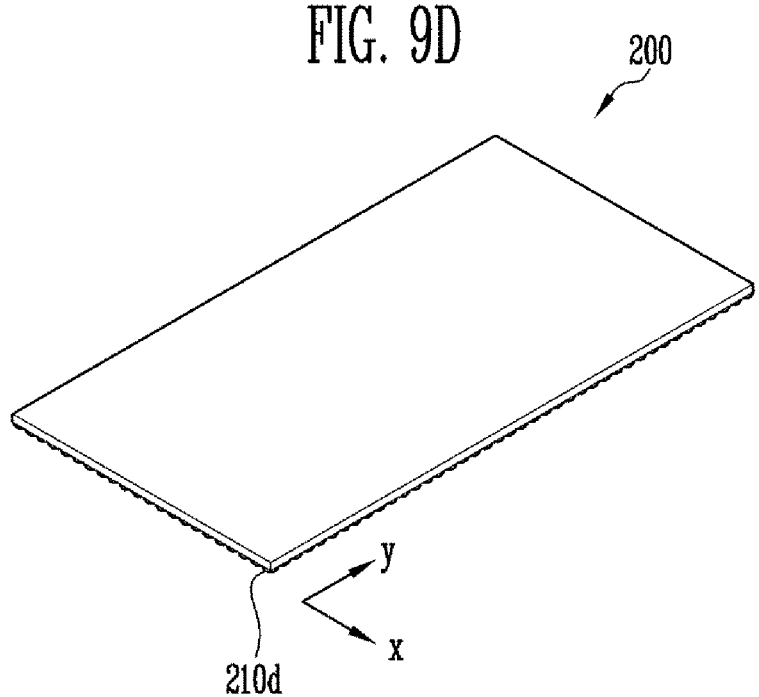

Referring to FIG. 9D, the light-condensing layer 200 may include at least one lens sheet (or at least one dot-shaped lens pattern layer) including a dot-shaped lens array. In an exemplary embodiment, the dot-shaped lens array may be composed of a plurality of curved lens patterns 210d. For example, the dot-shaped lens array may be implemented as an assembly of hemispherical embossed patterns.

As in the above-described exemplary embodiments, the light-condensing layer 200 may have various types of condensing patterns, for example, the prism patterns 210a, 210b, and 210c and/or the curved lens patterns 210d. Further, the light-condensing layer 200 may be implemented as an independent light-condensing layer, such as that illustrated in any one of FIGS. 9A to 9D, or as a combination (e.g., a laminated or stacked structure) of at least two of the light-condensing layers, such as those illustrated in FIGS. 9A to 9D.

Figure 10A:
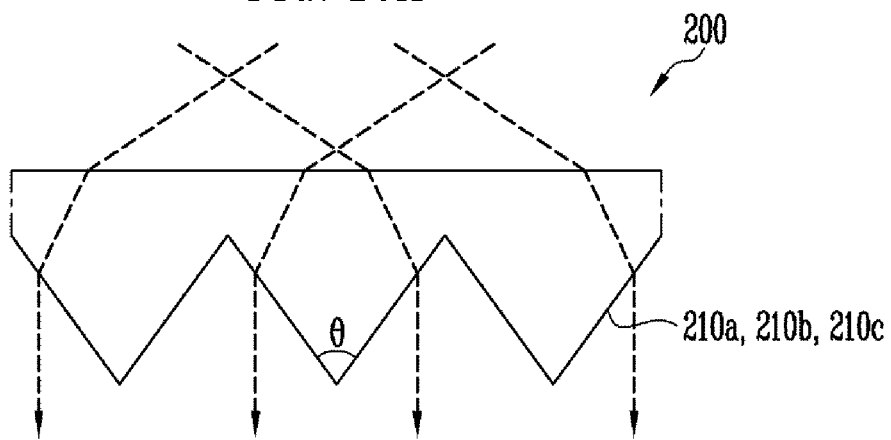
FIGS. 10A, 10B, and 10C are sectional views respectively illustrating an example of a light-condensing layer according to an exemplary embodiment.
Figure 10B:
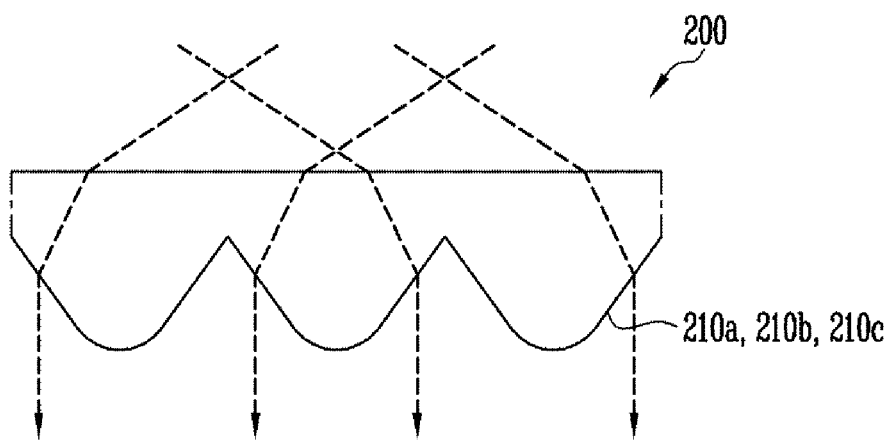
Figure 10C:
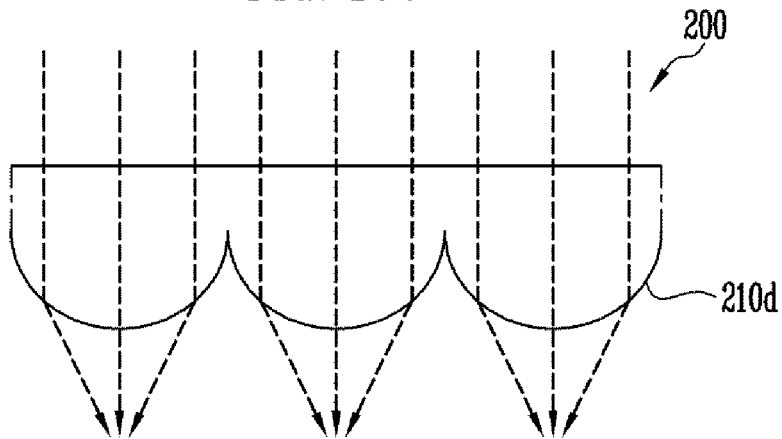

FIGS. 10A, 10B, and 10C are sectional views respectively illustrating an example of a light-condensing layer according to an exemplary embodiment of the present disclosure, and illustrate different examples related to sections of condensing patterns.

Referring to FIG. 10A, each of the above-described condensing patterns 210 may be implemented in the shape of the prism pattern 210a, 210b or 210c, and each of the prism patterns 210a, 210b, and 210c may have an isosceles triangular section having an apex angle (or, a vertical angle) θ falling within a predetermined range. For example, each of the condensing patterns 210 may be a triangular prism pattern. In an exemplary embodiment, the apex angle θ of the prism pattern 210a, 210b or 210c may be set by collectively considering the facilitation and reliability of a process, condensing efficiency, etc.

For example, the apex angle θ may be set within a range from 60° to 120°. When the apex angle θ is less than 60°, a process of manufacturing the prism pattern 210a, 210b or 210c may be complicated, or a portion corresponding to the apex angle θ may be easily damaged, whereas when the apex angle θ is greater than 120°, condensing efficiency may be relatively low, and thus it may be difficult to obtain a desired condensing effect.

Meanwhile, as described above with reference to FIGS. 9A to 9C, the light-condensing layer 200 may be configured by combining x-direction and y-direction prism sheets, or utilizing dot-shaped prism sheets. In this case, condensing efficiency may be further improved. For example, when the x-direction or y-direction prism sheet is independently used to configure a one-direction light-condensing layer 200, a condensing gain may be about 1.3, whereas when a cross-type light-condensing layer 200 is configured using a combination of the x-direction and y-direction prism sheets or using the dot-shaped prism sheets, the condensing gain may be increased up to about 1.5.

Referring to FIG. 10B, each prism pattern 210a, 210b or 210c may have a curved prism mountain (a protrusion having a curved surface, or, a circular/semicircular protrusion). That is, in an exemplary embodiment, the portion corresponding to the apex angle θ, illustrated in FIG. 10A, may be modified into a curved shape. In this case, condensing efficiency may be slightly decreased compared to the exemplary embodiment illustrated in FIG. 10A, but it is possible to obtain a condensing gain to some degree, and the facilitation and reliability of a process may be secured.

In addition, a section having the shape of a curved lens patterns 210d, such as that illustrated in FIG. 10C, may be acquired by forming the entire portion of each of the prism patterns 210a, 210b, and 210c in the shape of a curved surface. In this case, condensing efficiency may be slightly decreased compared to the exemplary embodiments illustrated in FIGS. 10A and 10B, but a condensing gain may be obtained to some degree, for example, as about 1.2, and the facilitation and reliability of a process may be secured.

Figure 11:
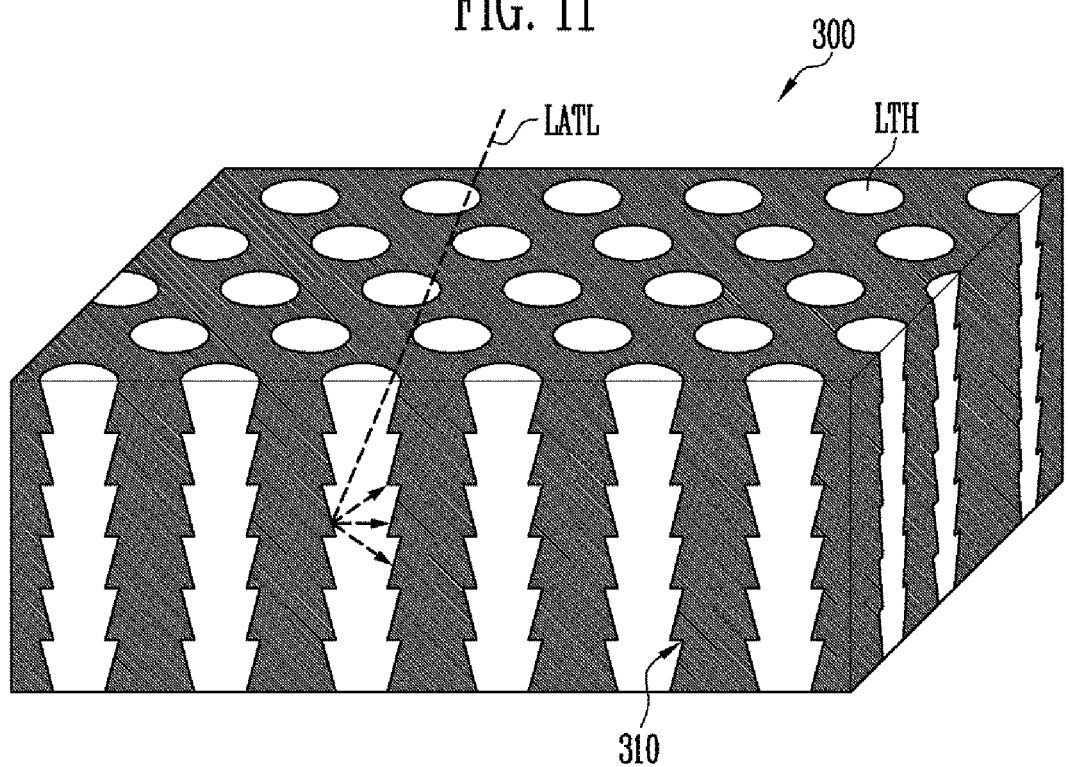
FIG. 11 is a perspective view illustrating a light-guiding layer according to an exemplary embodiment.

FIG. 11 is a perspective view illustrating a light-guiding layer according to an exemplary embodiment of the present disclosure.

Referring to FIG. 11, a light-guiding layer 300 may include a plurality of protrusion patterns 310 provided on inner walls of at least some of light-transmission holes LTH. For example, a plurality of protrusion patterns 310 may be formed on respective inner walls (cylindrical surfaces) of the light-transmission holes LTH. In an exemplary embodiment, each of the protrusion patterns 310 may have a wedge shape or a hemispherical shape, and, in addition, the shapes of the protrusion patterns 310 may be changed to various forms. Further, the size, the number and/or the array structure of the protrusion patterns 310 formed in respective light-transmission holes LTH may be changed in various forms. For example, the plurality of protrusion patterns 310 may be regularly or irregularly distributed to respective inner walls of the light-transmission holes LTH.

When the protrusion patterns 310 are formed in the inner walls of the light-transmission holes LTH in this way, light LATL diagonally incident on the inner walls of the light-transmission holes LTH may be scattered and/or absorbed. Accordingly, of the light incident on the light-guiding layer 300, only light corresponding to a desired direction and/or a desired angle may selectively pass through the light-guiding layer 300, and thus the light-guiding characteristics of the light-guiding layer 300 may be improved. Further, the angle and/or amount of light that is capable of passing through the light-guiding layer 300 may be controlled by adjusting the shapes and/or sizes of the light-transmission holes LTH and/or the protrusion patterns 310.

FIGS. 12A, 12B, 12C, and 12D are sectional views respectively illustrating a light-guiding layer according to an exemplary embodiment of the present disclosure. In detail, FIGS. 12A to 12D illustrate an exemplary embodiment in which the light-guiding layer is configured in a multilayer stack structure, and illustrate different modifications related to this structure.

Figure 12A:
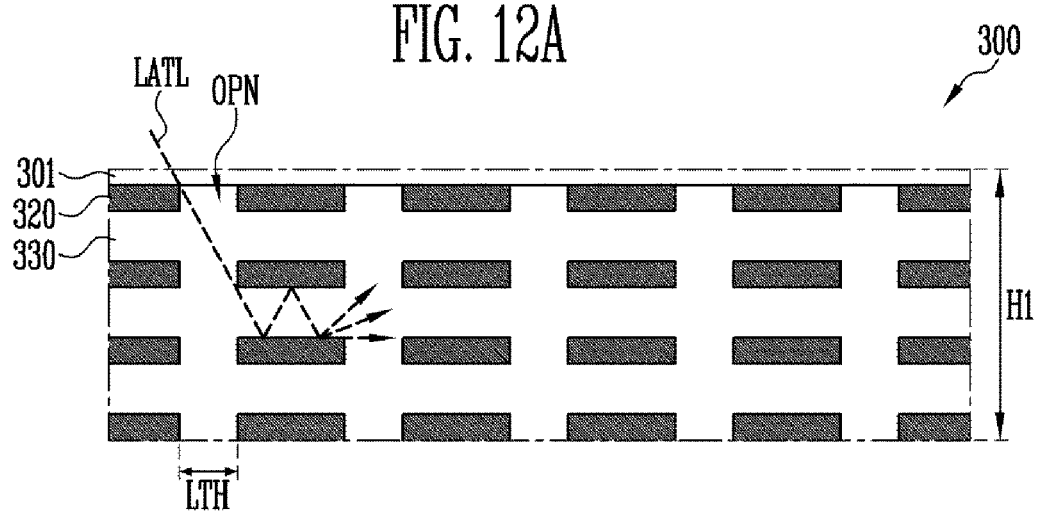
FIGS. 12A, 12B, 12C, and 12D are sectional views respectively illustrating a light-guiding layer according to an exemplary embodiment.

Referring to FIG. 12A, the light-guiding layer 300 may include a plurality of mask layers 320 arranged on a base substrate 301 and a middle layer 330 interposed between the mask layers 320. In an exemplary embodiment, the base substrate 301 may be arranged on a display panel 110.

The base substrate 301 and the middle layer 330 may each be made of a transparent or semitransparent material that satisfies light-transmission properties within a predetermined range. In an exemplary embodiment, the base substrate 301 may be a thin-film substrate made of a wafer, glass, plastic or metal material, and may be implemented as, for example, a transparent thin film. However, the material forming the base substrate 301 and/or the thickness range thereof are not especially limited. In an exemplary embodiment, the middle layer 330 may include a substantially transparent organic/inorganic material, and may include, for example, at least one light-transmissive organic layer and/or inorganic layer. However, the material forming the middle layer 330 and/or the thickness range thereof are not especially limited.

Each mask layer 320 may include a plurality of openings OPN corresponding to respective light-transmission holes LTH, and a remaining region other than the openings OPN may be made of a light-shielding and/or light-absorbing material.

In an exemplary embodiment, the base substrate 301 and the mask layer 320 may each be configured in the shape of a thin film. For example, the light-guiding layer 300 may be formed using a scheme for sequentially depositing thin-film mask layers 320 on the thin-film base substrate 301. Accordingly, the thickness (or height) H1 of the light-guiding layer 300 may be minimized.

Further, in an exemplary embodiment, the mask layers 320 may have openings OPN having the same size, and may be stacked such that the openings OPN of the mask layers 320 completely overlap each other in regions corresponding to the light-transmission holes LTH respectively. Here, the term "completely overlap" may denote a state in which the openings OPN are aligned such that they may maximally overlap each other within a range including a predetermined error range in which error may occur in a process.

In accordance with the above-described exemplary embodiment, in the light-guiding layer 300 configured in a multilayer stack structure, diagonal incident light LATL at an angle at which light cannot pass through all vertically overlapping openings OPN is extinguished while being continuously scattered, reflected and/or absorbed between the mask layers 320. Accordingly, of the light incident on the light-guiding layer 300, only light corresponding to a desired direction and/or a desired angle may selectively pass through the light-guiding layer 300, and thus the light-guiding properties of the light-guiding layer 300 may be improved.

Figure 12B:
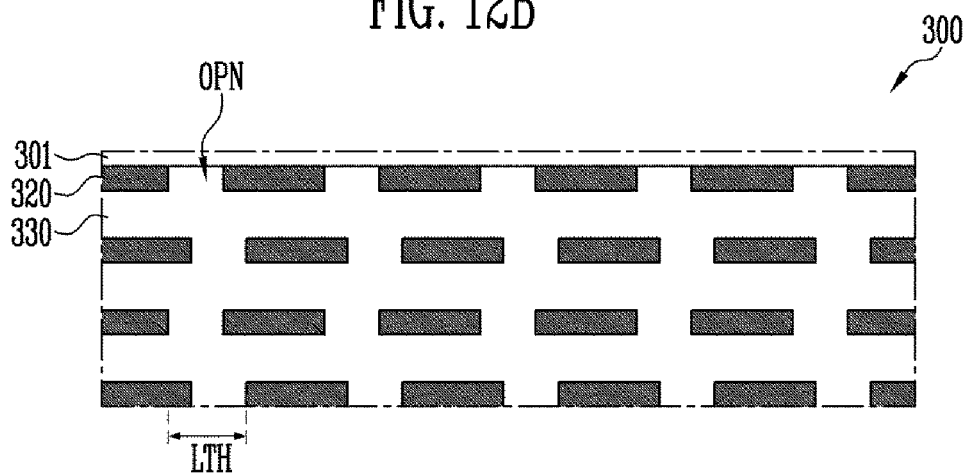

Referring to FIG. 12B, in an exemplary embodiment, the mask layers 320 may have openings OPN having the same size, and may be stacked such that the openings OPN of the mask layers 320 only partially overlap each other in regions corresponding to the light-transmission holes LTH respectively. For example, the openings OPN may be alternately stacked in zigzags on every single mask layer 320. Alternatively, the openings OPN may be alternately stacked in zigzags on every multiple mask layers 320.

Figure 12C:
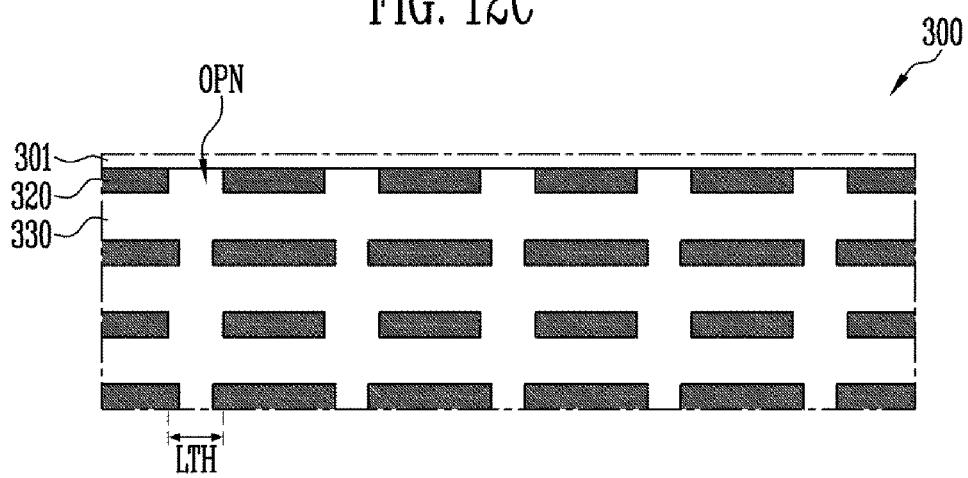

Referring to FIG. 12C, the light-guiding layer 300 may have openings OPN, the size of which changes every single mask layer 320 or gradually changes every multiple mask layers 320. That is, the mask layers 320 may have openings OPN having different sizes. Further, at least certain portions of the openings OPN of the mask layers 320 may overlap each other in the regions corresponding to respective light-transmission holes LTH.

In accordance with the exemplary embodiments of FIGS. 12B and 12C, there may be obtained an effect in which the protrusion patterns 310, such as those illustrated in FIG. 11, are applied to the light-guiding layer 300 having a multilayer stack structure. Accordingly, the light-guiding properties of the light-guiding layer 300 may be improved.

Figure 12D:
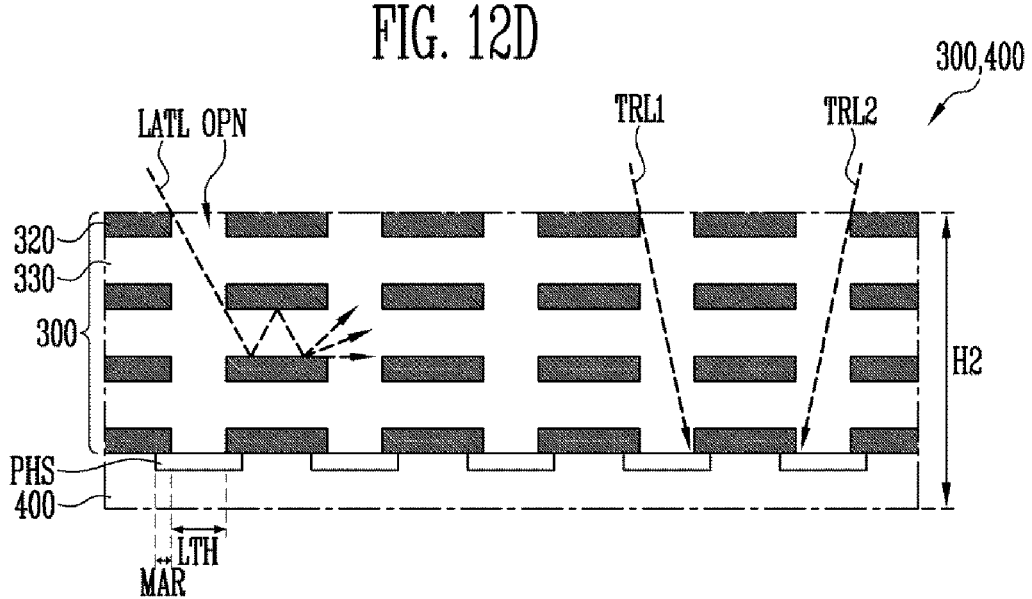

Referring to FIG. 12D, the light-guiding layer 300 may be directly arranged and/or formed on one surface of the photosensor layer 400. For example, a plurality of mask layers 320 are sequentially deposited on one surface of the photosensor layer 400 (e.g., a top surface on which the light-receiving units of photosensors PHS are located), and thus the light-guiding layer 300 may be formed. In this case, the base substrate 301, illustrated in FIGS. 12A to 12C, may not be provided, and the light-guiding layer 300 and the photosensor layer 400 may be integrated with each other.

In accordance with the above-described exemplary embodiments, a distance between the light-guiding layer 300 and the photosensor layer 400 may be minimized.

Accordingly, interference between lights TRL1 and TRL2, having passed through adjacent light-transmission holes LTH, respectively, may be prevented, and the overall thickness (or height) H2 of the light-guiding layer 300 and the photosensor layer 400 may be minimized. Further, in accordance with the above-described exemplary embodiments, respective light-transmission holes LTH may be easily aligned on the photosensors PHS corresponding thereto. Accordingly, an alignment margin (or error) MAR may be minimized.

Figure 13A:
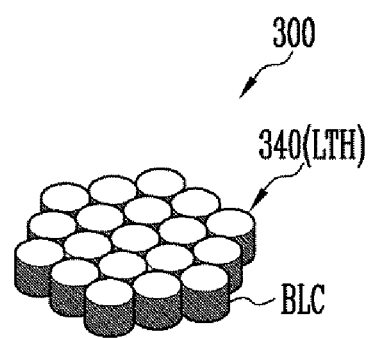
FIGS. 13A and 13B are a perspective view and a plan view illustrating a light-guiding layer according to an exemplary embodiment.
Figure 13B:
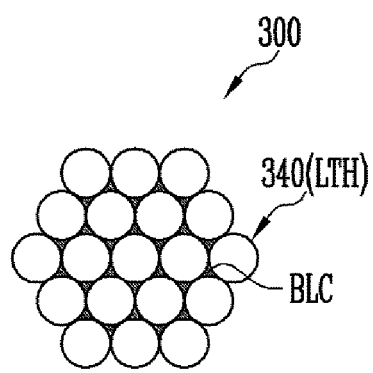

FIGS. 13A and 13B are a perspective view and a plan view illustrating a light-guiding layer according to an exemplary embodiment of the present disclosure.

Referring to FIGS. 13A and 13B, the light-guiding layer 300 may be implemented as a transparent tube bundle that includes a plurality of transparent tubes 340 forming light-transmission holes LTH. In an exemplary embodiment, each of the transparent tubes 340 may have, but is not limited to, a cylindrical shape. For example, the shape of each transparent tube 340 may be changed to other shapes such as a prismatic shape. Further, in some exemplary embodiments, the transparent tubes 340 may be made of glass, an optical fiber, a plastic material or the like, but is not limited thereto. That is, the material forming the transparent tubes 340 may be variously changed.

In an exemplary embodiment, a light-shielding film BLC containing a light-shielding material and/or a light-absorbing material may be provided on a cylindrical surface (e.g., an outer wall) of each of the transparent tubes 340. For example, respective cylindrical surfaces of the transparent tubes 340 may be coated with a light-shielding material having a dark color such as black and may be bonded to each other. That is, in an exemplary embodiment, the light-shielding film BLC may be implemented as, but is not limited to, a black coating film.

In accordance with the above-described exemplary embodiment, the transparent tubes 340 may be densely disposed. Accordingly, the received light amounts of the photosensors PHS may be increased by increasing the opening ratio of the light-guiding layer 300. Furthermore, since the light-shielding film BLC is arranged between the transparent tubes 340, light interference between adjacent transparent tubes 340 may be prevented, and light-guiding properties may be improved.

Meanwhile, in an exemplary embodiment, one or more functional coating films may be provided on at least one of the top surface and the bottom surface of each of the transparent tubes 340. For example, the top surface and/or the bottom surface of each of the transparent tubes 340 may be coated with an anti-reflective layer, an Infrared Ray (IR) filter and/or a color filter. Accordingly, desired functions may be easily applied to the light-guiding layer 300.

FIG. 14 is a view illustrating a method of manufacturing the light-guiding layer according to the exemplary embodiment of FIGS. 13A and 13B.

Referring to FIG. 14, under step ST1, each transparent tube 340a is prepared. Here, the diameter of the transparent tube 340a may be substantially identical to that of the light-transmission holes LTH desired to be formed in the light-guiding layer 300.

Thereafter, under step ST2, an outer surface of the transparent tube 340a is individually coated with a light-shielding material and/or a light-absorbing material. For example, a black coating film is formed on the outer surface of each transparent tube 340a, and thus a light-shielding film BLC may be formed on the outer surface of the transparent tube 340.

Thereafter, under step ST3, a transparent tube bundle is formed by bonding a plurality of transparent tubes 340a to each other, each transparent tube 340a being coated with the light-shielding film BLC.

Meanwhile, in an exemplary embodiment, the transparent tubes 340a may be bonded to each other using an adhesive having light-shielding properties, and thus a process for forming the light-shielding film BLC and a process for bonding the transparent tubes 340a may be integrated with each other.

Thereafter, under step ST4, the transparent tube bundle is cut in accordance with the thickness (or height) H3 of the light-transmission holes LTH desired to be formed in the light-guiding layer 300.

Under step ST5, in at least a part of the cut transparent tube bundle, the light-shielding film BLC may remain on a top surface UPS and/or a bottom surface DWS thereof. Here, the light-shielding film BLC is removed from the top surface and/or the bottom surface of the transparent tube bundle on which the light-shielding film BLC remains on the top surface and/or the bottom surface. For example, the light-shielding film BLC on the top surface and/or the bottom surface of the transparent tube bundle may be removed using a grinding operation. Accordingly, each transparent tube bundle is formed to allow light to pass through the top surface and the bottom surface thereof. Accordingly, the light-guiding layer 300 is manufactured.

In an exemplary embodiment, under step ST6, a functional coating film FUC may be additionally formed on the top surface and/or the bottom surface of each transparent tube 340. For example, the top surface and/or the bottom surface of the transparent tube bundle may be coated with an anti-reflective layer. However, the step of forming the functional coating film FUC may be selectively performed, and may be added if necessary.

Figure 15A:
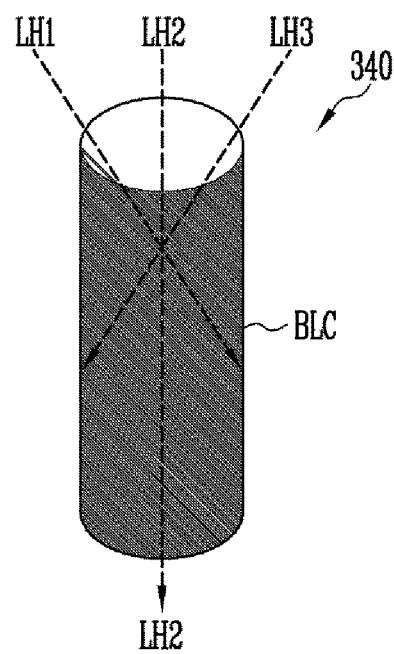
FIGS. 15A, 15B, and 15C are perspective views respectively illustrating an example of the transparent tube illustrated in FIGS. 13A and 13B.
Figure 15B:
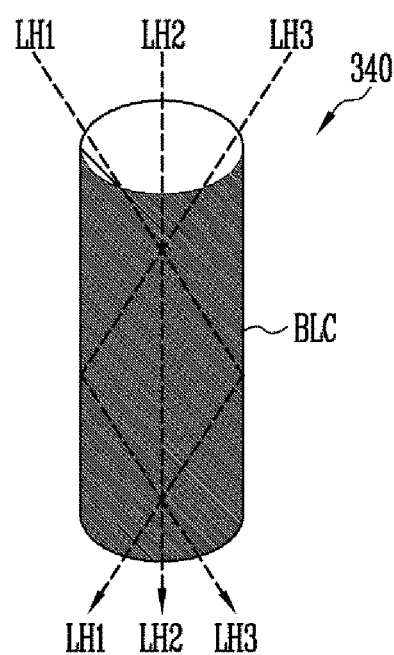
Figure 15C:
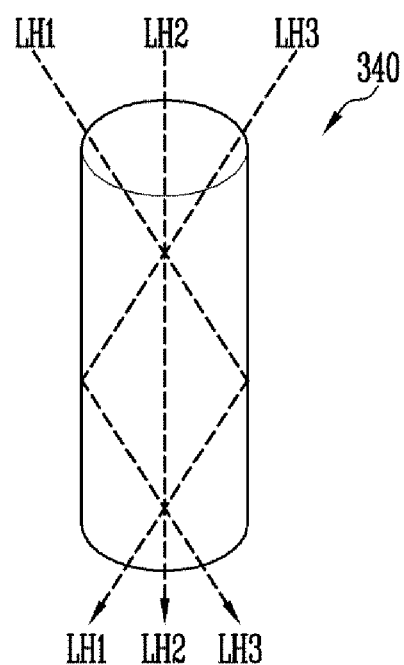

FIGS. 15A, 15B, and 15C are perspective views respectively illustrating an example of the transparent tube illustrated in FIGS. 13A and 13B together with the light-guiding property of the respective transparent tube.

Referring to FIG. 15A, each transparent tube 340 selectively transmits incident light which is inputted in a specific direction and/or at an angle within a specific range, among incident lights LH1, LH2, and LH3 inputted in various directions and/or at various angles. For example, the transparent tube 340 transmits the incident light LH2 which is inputted in a vertical direction (or in a diagonal direction falling within a predetermined angle range with respect to the vertical direction), and extinguishes remaining incident lights LH1 and LH3 through dispersion and/or absorption. Here, each transparent tube 340 includes a light-shielding film BLC formed on a cylindrical surface thereof, thus preventing light interference from occurring between adjacent transparent tubes 340.

Referring to FIG. 15B, each transparent tube 340 may be formed of an optical fiber including either a core or a core and a clad. In this case, among the incident lights LH1, LH2, and LH3 on the transparent tube 340, the incident light LH2 corresponding to a vertical direction (a diagonal direction falling within a predetermined angle range with respect to the vertical direction) passes through the transparent tube 340, and the remaining incident lights LH1 and LH3 may also pass through the transparent tube 340 while being totally reflected from the inside of the transparent tube 340. Therefore, when each transparent tube 340 is formed of an optical fiber, optical loss may be minimized and the received light amounts of photosensors PHS may be increased owing to total reflection effect.

Meanwhile, when each transparent tube 340 is formed of an optical fiber, light interference may be prevented from occurring between adjacent transparent tubes 340 even if a light-shielding film BLC is not formed. Therefore, in this case, the light-shielding film BLC may not be provided, and the cylindrical surface of each transparent tube 340 may be substantially transparent, as illustrated in FIG. 15C. That is, when the transparent tube 340 is formed of an optical fiber, the cylindrical surface of the transparent tube 340 may be coated with the light-shielding film BLC, or not.

As described above, in accordance with various exemplary embodiments, pixels PXL provided on the display panel 110 may be used as a light source of a fingerprint sensor to sense a user's fingerprint, and thus a fingerprint sensor may be configured within a display device without requiring a separate external light source. Accordingly, the thickness of the display device embedded with a fingerprint sensor may be reduced, and manufacturing cost of the display device may be decreased.

Further, in accordance with the above-described exemplary embodiments, the light-condensing layer 200, the light-guiding layer 300, and the photosensor layer 400 may be arranged on the rear surface of the display panel 110 (surface opposite an image display surface), thus preventing the photosensor layer 400 or the like from being perceived by the user. Accordingly, deterioration of image quality attributable to a structure in which a fingerprint sensor is configured in at least a portion of the display area DA may be prevented.

Furthermore, in accordance with the above-described exemplary embodiments, the light-condensing layer 200 and the light-guiding layer 300 may be arranged between the display panel 110 and the photosensor layer 400, thus not only increasing received light amounts of photosensors PHS but also improving light-guiding properties between the display panel 110 and the photosensor layer 400. Accordingly, a signal-to-noise ratio may be improved, and the reliability of the fingerprint sensor may be secured.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
    a display panel comprising a display area and a plurality of pixels arranged in the display area;
    a photosensor layer comprising a sensing area overlapping the display area and a plurality of photosensors arranged in the sensing area; and
    a light-guiding layer arranged between the display panel and the photosensor layer, the light-guiding layer comprising a plurality of light-transmission holes corresponding to the plurality of photosensors,
    wherein the light-guiding layer comprises a transparent tube bundle comprising a plurality of transparent tubes forming the light-transmission holes;
    wherein the light-guiding layer further comprises a light-shielding film provided on a cylindrical surface of each of the transparent tubes, and
    wherein the light-shielding film is provided on an outer wall of the cylindrical surface.

2. The display device according to claim 1, wherein each of the transparent tubes comprises a functional coating film provided on at least one of a top surface and a bottom surface thereof.

3. The display device according to claim 1, wherein each of the transparent tubes is formed of an optical fiber.

4. The display device according to claim 1, wherein the plurality of pixels emit light to a front surface of the display panel, and the photosensor layer is arranged on a rear surface of the display panel.

5. The display device according to claim 1, further comprising a light-condensing layer arranged between the display panel and the photosensor layer to overlap the light-guiding layer.

6. The display device according to claim 5, wherein the light-condensing layer comprises at least one of:
    a first light-condensing layer arranged between the display panel and the light-guiding layer; and
    a second light-condensing layer arranged between the light-guiding layer and the photosensor layer.

7. The display device according to claim 5, wherein the light-condensing layer comprises a plurality of condensing patterns that protrude in a direction towards the photosensor layer.

8. The display device according to claim 7, wherein the light-condensing layer comprises at least one of:
    a first direction prism sheet having a prism pattern extending along a first direction;
    a second direction prism sheet having a prism pattern extending along a second direction crossing the first direction;
    a dot-shaped prism sheet comprising a dot-shaped prism pattern; and
    a lens sheet having a dot-shaped lens array.

9. The display device according to claim 8, wherein the prism pattern comprises a protrusion that has a triangular section, an apex angle of the triangular section ranging from about 60° to 120°, or the protrusion has a shape of a curved surface.

10. The display device according to claim 5, wherein the light-condensing layer is configured to be integrated with the display panel.

11. The display device according to claim 1, wherein:
    each of the plurality of pixels comprises at least one light-emitting element; and
    at least some of the plurality of photosensors comprise a light-receiving unit disposed between light emission regions of at least two adjacent pixels.

* * * * *